(12) United States Patent
Li et al.

(10) Patent No.: US 9,537,571 B2
(45) Date of Patent: Jan. 3, 2017

(54) DUAL-FREQUENCY OPTICAL SOURCE

(71) Applicant: CALIFORNIA INSTITUTE OF TECHNOLOGY, Pasadena, CA (US)

(72) Inventors: Jiang Li, Pasadena, CA (US); Kerry Vahala, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 43 days.

(21) Appl. No.: 14/605,987

(22) Filed: Jan. 26, 2015

(65) Prior Publication Data
US 2015/0236789 A1 Aug. 20, 2015

Related U.S. Application Data

(60) Provisional application No. 61/931,060, filed on Jan. 24, 2014, provisional application No. 61/982,749, filed on Apr. 22, 2014.

(51) Int. Cl.
*H04B 10/00* (2013.01)
*H04L 7/00* (2006.01)
(Continued)

(52) U.S. Cl.
CPC ............ *H04B 10/2507* (2013.01); *H03L 7/08* (2013.01); *H03L 7/16* (2013.01); *H04B 10/2504* (2013.01);
(Continued)

(58) Field of Classification Search
CPC ............................... H01S 3/06791; H01S 3/30
(Continued)

(56) References Cited

U.S. PATENT DOCUMENTS 4,461,672 A 7/1984 Musser
4,938,841 A 7/1990 Shahar et al.
(Continued)

FOREIGN PATENT DOCUMENTS

JP 2010-050758 A 3/2010
KR 10-079625 B1 1/2008
WO 2013-063586 A1 5/2013

OTHER PUBLICATIONS

Black, Eric. "An Introduction to Pound-Drever-Hall laser frequency stabilziation". American Journal of Physics 68, 69, (2001); doi 10/1119/1.1296663, http://dx.doi.org/10.1119/1.1286663.*
(Continued)

*Primary Examiner* — David Payne
*Assistant Examiner* — Tanya Motsinger
(74) *Attorney, Agent, or Firm* — Steinfl & Bruno, LLP

(57) ABSTRACT

A dual-frequency optical source comprises: (a) first and second pump laser sources arranged to generate optical pump power at respective first and second pump laser frequencies $v_{pump1}$ and $v_{pump2}$; and (b) a fiber optical resonator characterized by a Brillouin shift frequency $v_B$ and a free spectral range that is substantially equal to an integer submultiple of the Brillouin shift frequency. Each one of the first and second pump laser sources is frequency-locked to a corresponding resonant optical mode of the fiber optical resonator. First and second optical output signals of the dual-frequency optical reference source at respective first and second output frequencies $v_1 = v_{pump1} - v_B$ and $v_2 = v_{pump2} - v_B$ comprise stimulated Brillouin laser output generated by simultaneous optical pumping of the fiber optical resonator by the first and second pump laser sources, respectively. An output difference frequency $v_2 - v_1$ is greater than about 300 GHz.

19 Claims, 12 Drawing Sheets

(51) Int. Cl.
*H04B 10/2507* (2013.01)
*H04B 10/2575* (2013.01)
*H04B 10/25* (2013.01)
*H04B 10/50* (2013.01)
*H03L 7/08* (2006.01)
*H03L 7/16* (2006.01)

(52) U.S. Cl.
CPC ........ *H04B 10/2575* (2013.01); *H04B 10/503* (2013.01); *H04L 7/0075* (2013.01); *H04L 7/0091* (2013.01)

(58) Field of Classification Search
USPC .................................. 372/94; 398/200, 201
See application file for complete search history.

(56) References Cited

U.S. PATENT DOCUMENTS

| | | | | |
|---|---|---|---|---|
| 5,351,252 | A * | 9/1994 | Toyama | H01S 3/302 356/461 |
| 5,398,256 | A | 3/1995 | Homimer et al. | |
| 5,723,856 | A | 3/1998 | Yao et al. | |
| 5,872,022 | A | 2/1999 | Motoda et al. | |
| 6,044,192 | A | 3/2000 | Grant et al. | |
| 6,580,532 | B1 | 6/2003 | Yao et al. | |
| 6,594,061 | B2 | 7/2003 | Huang et al. | |
| 6,763,042 | B2 * | 7/2004 | Williams | H01S 3/067 372/20 |
| 6,865,348 | B2 * | 3/2005 | Miyamoto | H04B 10/505 398/182 |
| 6,891,864 | B2 | 5/2005 | Vahala et al. | |
| 6,895,133 | B1 | 5/2005 | Calkins et al. | |
| 7,085,499 | B2 | 8/2006 | Yap et al. | |
| 7,142,570 | B2 * | 11/2006 | Lee | G02F 2/002 356/484 |
| 7,187,871 | B1 | 3/2007 | Kaushik | |
| 7,260,279 | B2 | 8/2007 | Gunn et al. | |
| 7,272,160 | B1 * | 9/2007 | Geng | H01S 3/302 372/29.011 |
| 7,362,927 | B1 | 4/2008 | Ilchenko et al. | |
| 7,515,617 | B1 | 4/2009 | Vahala et al. | |
| 7,590,326 | B2 | 9/2009 | Fincato et al. | |
| 7,616,850 | B1 | 11/2009 | Watts et al. | |
| 7,764,720 | B1 * | 7/2010 | Bronder | 372/3 |
| 7,929,589 | B1 | 4/2011 | Ilchenko et al. | |
| 8,045,834 | B2 | 10/2011 | Painter et al. | |
| 8,094,987 | B2 | 1/2012 | Armani | |
| 8,102,597 | B1 | 1/2012 | Maleki | |
| 8,103,175 | B1 * | 1/2012 | Kowalczyk | H04B 10/25759 359/334 |
| 8,377,320 | B2 | 2/2013 | Wang et al. | |
| 8,451,528 | B1 | 5/2013 | Kuo | |
| 8,620,158 | B2 | 12/2013 | Peach et al. | |
| 8,761,555 | B2 | 6/2014 | Matsko et al. | |
| 8,818,146 | B2 | 8/2014 | Li et al. | |
| 8,848,760 | B2 | 9/2014 | Vahala et al. | |
| 8,917,444 | B2 | 12/2014 | Li et al. | |
| 9,042,003 | B2 | 5/2015 | Li et al. | |
| 9,178,520 | B2 | 11/2015 | Witzens | |
| 9,197,032 | B2 * | 11/2015 | Qiu | H01S 3/1304 |
| 9,293,887 | B2 | 3/2016 | Li et al. | |
| 2001/0014106 | A1 | 8/2001 | Gevorgian et al. | |
| 2001/0030796 | A1 | 10/2001 | Yao | |
| 2002/0181041 | A1 | 12/2002 | Tong | |
| 2004/0179573 | A1 | 9/2004 | Armani et al. | |
| 2005/0111776 | A1 | 5/2005 | Martin et al. | |
| 2005/0163185 | A1 | 7/2005 | Vahala et al. | |
| 2005/0169331 | A1 | 8/2005 | Vahala et al. | |
| 2006/0187537 | A1 | 8/2006 | Huber et al. | |
| 2007/0127930 | A1 | 6/2007 | Prodanov et al. | |
| 2007/0160093 | A1 * | 7/2007 | Nishizawa | G02F 1/3534 372/21 |
| 2007/0230856 | A1 | 10/2007 | Yamazaki | |
| 2008/0075464 | A1 | 3/2008 | Maleki et al. | |
| 2008/0203052 | A1 | 8/2008 | Hossein-Zadeh et al. | |
| 2009/0028504 | A1 | 1/2009 | Wu et al. | |
| 2009/0079967 | A1 * | 3/2009 | Radic | G01M 11/319 356/73.1 |
| 2009/0285542 | A1 | 11/2009 | Armani et al. | |
| 2011/0090936 | A1 | 4/2011 | Kupershmidt | |
| 2011/0103801 | A1 * | 5/2011 | Breunig | H04B 10/2575 398/118 |
| 2012/0194901 | A1 * | 8/2012 | Bravo-Abad | H01Q 1/38 359/330 |
| 2012/0320448 | A1 | 12/2012 | Li et al. | |
| 2012/0321245 | A1 | 12/2012 | Vahala et al. | |
| 2013/0010819 | A1 | 1/2013 | Ahmad et al. | |
| 2013/0083813 | A1 | 4/2013 | Hartog | |
| 2013/0163620 | A1 | 6/2013 | Lecoeuche | |
| 2014/0112357 | A1 * | 4/2014 | Abedin | H01S 3/0675 372/3 |
| 2014/0152994 | A1 * | 6/2014 | Wu | G01C 19/727 356/461 |
| 2015/0092808 | A1 * | 4/2015 | Li | H01S 5/1075 372/95 |
| 2015/0236784 | A1 | 8/2015 | Vahala et al. | |
| 2015/0236789 | A1 | 8/2015 | Vahala et al. | |
| 2015/0311662 | A1 * | 10/2015 | Vahala | H01S 3/302 250/552 |

OTHER PUBLICATIONS

Adar, R., et al., Less than 1 dB Per Meter Propagation Loss of Silica Waveguides Measured Using a Ring Resonator, J. Lightwave Tech. 1994, 12: 1369-1372.

Agrawal, G.P. "Mode-partition noise intensity correlation is a two-mode semiconductor laser" *Physical Review A* vol. 37, No. 7 (1988) pp. 2488-2494.

Alnis et al. "Thermal-noise limited laser stabilization to a crystalline whispering-gallery-mode resonator" arXiv:1102.4227v1 (Feb. 21, 2011).

Anetsberger, G., et al., Ultralow-dissipation optomechanical resonators on a chip, Nature Photonics 2008, 2: 627-633.

Aoki, T., et al., "Observation of strong coupling between one atom and a monolithic microresonator", Nature 2006, 443: 671-674.

Armani, D.K., et al. "Ultra-high-Q toroid microcavity on a chip." Nature, vol. 421, pp. 925-928, 2003.

Barwicz, T., et al., "Three-Dimensional Analysis of Scattering Losses Due to Sidewall Roughness in Microphotonic Waveguides", J. Lightwave Tech. 2005, 23: 2719-2732.

Bauters, J., et al. "Ultra-low-loss high-aspect-ratio Si3N4 waveguides", Optics Express 2011, 19: 3163-3164.

Black. "An introduction to Pound-Drever-Hall laser frequency stabilization" American Journal of Physics. vol. 69; No. 1; p. 79. (2001).

Braje, D., et al., "Brillouin-Enhanced Hyperparametric Generation of an Optical Frequency Comb in a Monolithic Highly Nonlinear Fiber Cavity Pumped by a cw Laser", Phys. Rev. Letters 2009, PRL 102: 193902-1-193902-4.

Cai, M., et al., "Observation of Critical Coupling in a Fiber Taper to a Silica-Microsphere Whispering-Gallery Mode System", Phys. Rev. Letters 2000, 85: 74-77.

Carmon, T., et al., "Dynamical thermal behavior and thermal self-stability of microcavities", Optics Express 2004, 12: 4742-4750.

Ciminelli, C., et al., "Photonic technologies for angular velocity sensing", Adv. Opt. & Photo. 2010, 2: 370-404.

Ciminelli, C., et al., "Three-dimensional modeling of scattering loss in InGaAsP/InP and silica-on-silicon bent waveguides", J. Europ. Opt. Society 2009, 4: 09015-1-09015-6.

Del'Haye, P., et al., "Frequency comb assisted diode laser spectroscopy for measurement of microcavity dispersion", Nature Photonics 2009, 3: 529-533.

Del'Haye, P., et al., "Full Stabilization of a Microresonator-Based Optical Frequency Comb", Phys. Rev. Letters 2008, PRL 101: 053903-1-053903-4.

(56) References Cited

OTHER PUBLICATIONS

Del'Haye, P., et al., "Octave Spanning Tunable Frequency Comb from a Microresontaor", Phys. Rev. Letters 2011, PRL 107: 063901-1-063901-4.
Del'Haye, P., et al., "Optical frequency comb generation from a monolithic microresonator", Nature 2007, 450: 1214-1218.
Ferdous, F., et al., "Spectral line-by-line pulse shaping of on-chip microresonator frequency combs", Nature Photonics 2011, 5: 770-776.
Foster, M., et al., "Silicon-based monolithic optical frequency comb source", Optics Express 2011, 19: 14233-14239.
Geng, J. et al. "Narrow Linewidth Fiber Laser for 100-km Optical Frequency Domain Reflectometry," IEEE Photon. Technol. Lett. 17, 1827-1929, 2005.
Gorodetsky, M., et al., "Fundamental thermal fluctuations in microspheres", J. Opt. Soc. Am. B 2004, 21: 697-705.
Gorodetsky, M.L., et al. "Ultimate Q of optical microsphere resonators." Optics Letters, vol. 21, No. 7, pp. 453-455, 1996.
Grudinin, I., et al., "Brillouin Lasing with a CaF2 Whispering Gallery Mode Resonator", Phys. Rev. Letters 2009, PRL 102: 043902-1-043902-4.
Grudinin, I., et al., "Generation of optical frequency combs with a CaF2 resonator", Optics Letters 2009, 34: 878-880.
Grudinin, I., et al., "On the fundamental limits of Q factor of crystalline dielectric resonators", Optics Express 2007, 15: 3390-3395.
Grudinin, I., et al., "Ultrahigh optical Q factors of crystalline resonators in the linear regime", Phys. Rev. Letters A 2006, 74: 063806-1-063806-9.
Hansch, T.W., et al., Laser Frequency Stabilization by Polarization Spectroscopy of a Reflecting Reference Cavity, Optics Comm. 1980, 35: 441-444.
Hossein-Zadeh, M. and Vahala, K.J. "Importance of Intrinsic-Q in Microring-Based Optical Filters and Dispersion-Compensation Devices." Photonics Technology Letters, vol. 19, Issue 14, pp. 1045-1047, 2007.
Illchenko, V.S., et al., Optical Resonators with Whispering-Gallery Modes—Part II: Applications, IEEE J. Selected Topics in Quna. Elec. 2006, 12: 15-32.
Ip, E., et al., Coherent detection in optical fiber systems, Optics Express 2008, 16: 753-791.
Johnson, A., et al., Chip-based frequency combs with sub-100 GHz repetition, Optics Letters 2012, 37: 875-877.
Karlsson, C., et al., All-fiber multifunction continuous-wave coherent laser radar at 1.55 µm for range, speed, vibration, and wind measurements, Applied Optics 2000, 39: 3716-3726.
Kasai, K., et al., 256-QAM (64 Gb/s) Coherent Optical Transmission Over 160 km With an Optical Bandwidth of 5.4 GHz, IEEE Phon. Tech. Letters 2010, 22: 185-187.
Kippenberg, T.J, et al., Cavity Opto-Mechanics, Optics Express 2007, 15: 17172-17205.
Kippenberg, T.J, et al., Cavity Optomechanics: Back-Action at Mesoscale, Science 2008, 321: 1172-1176.
Kippenberg, T.J, et al., Microresonator-Based Optical Frequency Combs, Science 2011, 332: 555-559.
Kippenberg, T.J. et al. "Fabrication and coupling to planar high-Q silica disk microcavities," Applied Physics Letters, vol. 83(4), pp. 797-799, 2003.
Kippenberg, T.J., et al., Demonstration of an erbium-doped microdisk laser on a silicon chip, Phys. Rev. A 2006, 74: 051802(R)-1-051802(R).
Kippenberg, T.J., et al., Kerr-Nonlinearity Optical Parametric Oscillation in an Ultrahigh-$Q$ Toroid Microcavity, Phys. Rev. Letters 2004, 93: 083904-1-083904-4.
Kohtoku, M., et al. "New Waveguide Fabrication Techniques for Next-generation PLCs." NTT Technical Review, vol. 3, No. 7, pp. 37-41, 2005.
Kominato, Extremely Low-loss (0.3 dB/m) and Long Silica-Based Waveguides with Large Widtth and Clothoid Curve Connection, ECOC Proceedings 2004, 2: pp. 1-2.

Lee, H. et al. "Ultra-Low-Loss Optical Delay Line on a Silicon Chip." 7 pgs. Mar. 20, 2012.
Lee, H., et al., Ultra-high-Q wedge-resonator on a silicon chip, arXiv: 1112.2196v1 2011, pp. 1-5.
Levy, J., et al., CMOS-compatible multiple-wavelength oscillator for on-chip optical interconnects, Nature Photonics 2009, 4: 37-40.
Li, J. et al. "Chip-Based Frequency Combs with Microwave Repetition Rate." 6 pgs. Mar. 28, 2012.
Li, J., et al., Chip-based Brillouin lasers as spectral purifiers for photonic systems, arXiv:1201.4212 2011, pp. 1-5.
Li, J., et al., Highly Coherent, Microcavity Brillouin Laser on Silicon, FIO/LS Tech. Digest 2011, pp. 1-2.
Li, J., et al., Low-Pump-Power, Low-Phase-Noise, and Microwave to Millimeter-Wave Repetition Rate Operation in Microcombs, Physical Review Letters 2012, 109: 233901-1-233901-5.
Lu, T., et al., Frequency Noise of a Microchip Raman Laser, CLEO 2009, pp. 1-2.
Lu., T., et al., High sensitivity nanoparticle detection using optical microcavities, PNAS 2011, 108: 5976-5979.
Lytollis J., et al. "Infra-red optical communication systems." Infra-red Physics, vol. 8, Issue 1, pp. 123-129; 1968.
Matsko, A., et al., Optical Resonators with Whispering Gallery-Gallery Modes—Part I: Basics, IEEE J. Selected Topics in Quna. Elec. 2006, 12: 3-14.
Matsko, A., et al., Whispering-gallery-mode resonators as frequency references. I. Fundamental limitations, J. Opt. Soc. Am. B 2007, 24: 1324-1335.
Okai, M., et a., Strained multiquantum-well corrugation-pitch-modulated distributed feedback laser with ultranarrow (3.6 kHz) spectral linewidth, Elec. Letters 1993, 29: 1696-+.
Okawachi, Y., et al., Octave-spanning frequency comb generation in a silicon nitride chip, Optics Letters 2011, 36: 3398-3400.
Okawachi, Y., et al., Tunable All-Optical Delays via Brillouin Slow Light in an Optical Fiber, Phys. Rev. Letters 2005, PRL 94: 153902-1-153902-4.
Pant, R., et al., Cavity enhanced stimulated Briollouin scattering in an optical chip for multiorder Stokes generation, Optics Letters 2011, 36: 3687-3689.
Papp, S.B. et al. "Spectral and temporal characterization of a fused-quartz-microresonator optical frequency comb" *Physical Review A*, vol. 84, pp. 053833-1-053833-7 (2011).
Payne, S., et al., A theoretical analysis of scattering loss from planar optical waveguides, Opt. and Quan. Elec. 1994, 26: 977-986.
Poulsen, M.R. et al., "Advances in silica-based integrated optics." Opt. Eng., vol. 42, 2821-2834, Oct. 2003.
Quinlan, F., et al., A 12.5 GHz-spaced optical frequency comb spanning >400 nm for near-infrared astronomical spectrograph calibration, Rev. Sci. Instr. 2010, 81: 063105-1-063105-9.
Rafac, R.J., et al., Sub-dekahertz Ultraviolet Spectroscopy of 199 Hg+, Phys. Rev. Letters 2000, 85: 2462-2465.
Razzari, L., et al., CMOS-compatible integrated optical hyperparametric oscillator, Nat. Phon. 2009, 4: 41-45.
Savchenkov, A., et al., Low Threshold Optical Oscillations in a Whispering Gallery Mode CaF2 Resonator, Phys. Rev. Letters 2004, PRL 93: 243905-1-243905-4.
Savchenkov, A., et al., Optical resonators with ten million finesse, Optics Express 2007, 15: 6768-6773.
Savchenkov, A., et al., Tunable Optical Frequency Comb with a Crystalline Whispering Gallery Mode Resonator, Phys. Rev. Letters 2008, PRL 101: 093902-1-093902-4.
Savchenkov, A., et al., Whispering-gallery-mode resonators as frequency references. II. Stabilization, J. Opt. Soc. Am. B 2007, 24: 2988-2997.
Savory, S., et al., Laser Linewidth Requirements for Optical DQPSK Systems, IEEE Photo. Tech. Letters 2004, 16: 930-932.
Schawlow, A.L., et al., Infrared and Optical Masers, Phys. Rev. 1958, 112: 1940-1949.
Schliesser, A., et al., Resolved-sideband cooling of a micromechanical oscillator, Nature Physics 2008, 4: 415-419.
Shi, J.W., et al., High-Speed, High-Responsivity, and High-Power Performance of Near-Ballistic Uni-Traveling-Carrier Photodiode at 1.55 µm Wavelength, IEEE Photo. Tech. Letters 2005, 17: 1929-1931.

(56) References Cited

OTHER PUBLICATIONS

Spillane, S.M., et al., Ideality in a Fiber-Taper-Coupled Microresonator System for Application to Cavity Quantum Electrodynamics, Phys. Rev. Letters 2003, 91: 043902-1-043902-4.
Spillane, S.M., et al., Ultralow-threshold Raman laser using a spherical dielectric microcavity, Nature 2002, 415: 621-623.
Syms, R.R.A. et al., "Reflow and Burial of Channel Waveguides Formed in Sol-Gel Glass on Si Substrates." IEEE Photonics Technology Letters, vol. 5, No. 9, 1077-1079, Sep. 1993.
Tien, M.C., et al., Ultra-high quality factor planar Si3N4 ring resonators on Si substrates, Optics Express 2011, 19: 13551-13556.
Tkach, RW, et al., Spontaneous Brillouin Scattering for Single-Mode Optical-Fibre Characterisation, Elec. Letters 1986, 22: 1011-1013.
Tomes, M., et al., Photonic Micro-Electromechanical Systems Vibrating at X-band (11-GHz) Rates, Phys. Rev. Letters 2009, PRL 102: 113601-1-113601-4.
Udem, Th., et al., Optical frequency metrology, Nature 2002, 416: 233-237.
Vahala, K., et al., Semiclassical Theory of Noise in Semiconductor Lasers—Part I, IEEE J. Quan. Elec. 1983, QE-19: 1096-1101.
Vahala, K.J. Optical microcavities, Nature, vol. 424, No. 6950, pp. 839-846, 2003.
Veroony, D.W., et al., High-$Q$ measurements of fused-silica microspheres in the near infrared, Optics Express 1998, 23: 247-249.
Vollmer, F., et al., Whispering-gallery-mode biosensing: label-free detection down to single molecules, Nature Methods 2008, 5: 591-596.
Xu et al. "Archimedean spiral cavity ring resonators in silicon as ultra-compact optical comb filters" Optics Express. vol. 18; No. 3; pp. 1937-1945. 2010.
Xu et al. "Folded cavity SOI microring sensors for high sensitivity and real time measurment of biomolecular binding" Optics Express. 16, 15137 (2008).
Yang, L., et al., A 4-Hz Fundamental Linewidth on-chip Microlaser, CLEO 2007, pp. 1-2.
Zhu, Z., et al., Broadband SBS Slow Light in an Optical Fiber, J. Lightwave Tech. 2007, 25: 201-206.
Zhu, Z., et al., Stored Light in an Optical Fiber via Stimulated Brillouin Scattering, Science 2007, 318: 1748-1750.
International Search Report and Written Opinion for International Application PCT/US2013/032717. Mail Date: Jul. 26, 2013.
International Search Report and Written Opinion for International Application PCT/US2015/012962. Mail Date: Nov. 12, 2015.
International Search Report and Written Opinion for International Application PCT/US2015/012964. Mail Date: Nov. 12, 2015.
International Search Report and Written Opinion for International Application PCT/US2015/019080. Mail Date: Dec. 29, 2015.
International Preliminary Report on Patentability for International Application PCT/US2013/032717. Mail Date: Dec. 9, 2014.
Ex Parte Quayle Action mailed on Jul. 7, 2014 for U.S. Appl. No. 13/525,189, filed Jun. 15, 2012 in the name of Jiang Li et al.
Non-Final Office Action issued for U.S. Appl. No. 12/436,935, filed May 7, 2009 in the name of Andrea Martin Armani mail date: May 3, 2011.
Notice of Allowance mailed on Nov. 25, 2011 for U.S. Appl. No. 13/033,391, filed Feb. 23, 2011 in the name of Andrea Martin Armani et al.
Non-Final Office Action mailed on Sep. 1, 2011 for U.S. Appl. No. 13/033,391, filed Feb. 23, 2011 in the name of Andrea Martin Armani et al.
Notice of Allowance issued for U.S. Appl. No. 12/436,935, filed May 7, 2009 in the name of Andrea Martin Armani mail date: Jul. 26, 2011.
Notice of Allowance mailed on Jan. 30, 2015 for U.S. Appl. No. 14/513,058, filed Oct. 13, 2014 in the name of California Institute of Technology.
Notice of Allowance mailed on Jun. 16, 2014 for U.S. Appl. No. 13/494,707, filed Jun. 12, 2012 in the name of Kerry Vahala et al.
Notice of Allowance mailed on Sep. 8, 2014 for U.S. Appl. No. 13/525,189, filed Jun. 15, 2012 in the name of Jiang Li et al.
Restriction Requirement issued for U.S. Appl. No. 12/436,935, filed May 7, 2009 in the name of Andrea Martin Armani mail date: Dec. 29, 2010.
Restriction Requirement mailed on Aug. 15, 2014 for U.S. Appl. No. 13/525,147, filed Jun. 15, 2012 in the name of Jiang Li et al.
Restriction Requirement mailed on Dec. 29, 2010 for U.S. Appl. No. 12/436,935, filed May 7, 2009 in the name of Andrea Martin Armani et al.
Restriction Requirement mailed on May 31, 2014 for U.S. Appl. No. 13/525,189, filed Jun. 15, 2012 in the name of Jiang Li et al.
L. Goldberg, H. F. Taylor, J. F.Weller, and D. M. Bloom, "Microwave signal generation with injection locked laser diodes," Electron. Lett. 19, 491-493 (1983).
Pillet, G., Morvan, L., Brunel, M., Bretenaker, F., Dolfi, D., Vallet, M., Huignard, J.-P., and Le Floch, A., "Dual frequency laser at 1.5 µm for optical distribution and generation of high-purity microwave signals," J. Lightwave Technol. 26, 2764-2773 (2008).
Schneider, G. J., Murakowski, J. A., Schuetz, C. A., Shi, S., and Prather, D. W., "Radio frequency signal-generation system with over seven octaves of continuous tuning," Nat. Photon. 7, 118-122 (2013).
Li, J., Lee, H., and Vahala., K.J., "Microwave synthesizer using an on-chip Brillouin oscillator," Nat. Commun. 4, 2097 (2013).
Fortier, T., et al., "Generation of ultrastable microwaves via optical frequency division," Nat. Photon. 5, 425-429 (2011).
H. Murata, A. Morimoto, T. Kobayashi, and S. Yamamoto, "Optical Pulse Generation by Electrooptic-Modulation Method and Its Application to Integrated Ultrashort Pulse Generators," IEEE J. Sel. Top. Quantum Electron. 6, 1325 (2000).
M. Fujiwara, J. Kani, H. Suzuki, K. Araya, M. Teshima, "Flattened optical multicarrier generation of 12.5 GHz spaced 256 channels based on sinusoidal amplitude and phase hybrid modulation," IEEE Electron. Lett. 37, 967-968 (2001).
A. J. Metcalf, V. Torres-Company, D. E. Leaird, and A. M. Weiner, "High-power broadly tunable electro-optic frequency comb generator," IEEE J. Sel. Top. Quantum Electron. 19, 3500306 (2013).
A. Rolland, G. Loas, M. Brunel, L. Frein, M. Vallet, and M. Alouini, "Non-linear optoelectronic phase-locked loop for stabilization of opto-millimeter waves: towards a narrow linewidth tunable THz source," Opt. Express 19, 17944-17950 (2011).
William C. Swann, Esther Baumann, Fabrizio R. Giorgetta, and Nathan R. Newbury, "Microwave generation with low residual phase noise from a femtosecond fiber laser with an intracavity electro-optic modulator," Opt. Express 19, 24387-24395 (2011).
Papp, S. B., Beha, K., DelHaye, P., Quinlan, F., Lee, H., Vahala, K. J., Diddams, S. A., "A microresonator frequency comb optical clock," arXiv:1309.3525 (2013).
C. B. Huang, S. G. Park, D. E. Leaird, and A. M. Weiner, "Nonlinearly broadened phase-modulated continuous-wave laser frequency combs characterized using DPSK decoding," Opt. Express 16, 2520-2527 (2008).
I. Morohashi, T. Sakamoto, H. Sotobayashi, T. Kawanishi, and I. Hosako, "Broadband wavelength-tunable ultrashort pulse source using a Mach-Zehnder modulator and dispersion-flattened dispersion-decreasing fiber," Opt. Lett. 34, 2297-2299 (2009).
A. Ishizawa, T. Nishikawa, A. Mizutori, H. Takara, A. Takada, T. Sogawa, and M. Koga, "Phase-noise characteristics of a 25-GHz-spaced optical frequency comb based on a phase- and intensity-modulated laser," Opt. Express 21, 29186-29194 (2013).
S. Suzuki, K. Kashiwagi, Y. Tanaka, Y. Okuyama, T. Kotani, J. Nishikawa, H. Suto, M. Tamura, and T. Kurokawa, "12.5 GHz Near-IR Frequency Comb Generation Using Optical Pulse Synthesizer for Extra-Solar Planet Finder," in Nonlinear Optics, OSA Technical Digest: Nonlinear Optics Conference (Optical Society of America, 2013), paper NM3A.3.
Young, B., Cruz, F., Itano, W., and Bergquist, J., "Visible Lasers with Subhertz Linewidths," Phys. Rev. Lett. 82, 3799-3802 (1999).
T. Kessler, C. Hagemann, C. Grebing, T. Legero, U. Sterr, F. Riehle, M. J. Martin, L. Chen, and J. Ye., "A sub-40-mHz-linewidth laser based on a silicon single-crystal optical cavity," Nat. Photon. 6, 687-692 (2012).

(56) References Cited

OTHER PUBLICATIONS

Lee, H., Chen, T., Li, J., Yang, K. Y., Jeon, S., Painter, O., and Vahala, K. J., "Chemically etched ultrahigh-Q wedge resonator on a silicon chip," Nat. Photon. 6, 369-373 (2012).

Li, J., Lee, H., Chen, T., and Vahala, K. J., "Characterization of a high coherence, brillouin microcavity laser on silicon," Opt. Express 20, 20170-20180 (2012).

J. Li, H. Lee, K. Y. Yang, and K. J. Vahala, "Sideband spectroscopy and dispersion measurement in microcavities," Opt. Exp. 20, 26337-26344 (2012).

Dreyer, R., Hall, J. L., Kowalski, F., Hough, J., Ford, G., Munley, A., and Ward, H., "Laser phase and frequency stabilization using an optical resonator," Appl. Phys. B 31, 97-105 (1983).

Gross, M. C., Callahan, P. T., Clark, T. R., Novak, D., Waterhouse, R. B., and Dennis, M. L., "Tunable millimeter-wave frequency synthesis up to 100 GHz by dual-wavelength Brillouin fiber laser," Opt. Express 18, 13321-13330 (2010).

Callahan, P. T., Gross, M. C., and Dennis, M. L., "Frequency-independent phase noise in a dual-wavelength Brillouin fiber laser," IEEE J. Quantum Electron. 47, 1142-1150 (2011).

T. Sakamoto, T. Kawanishi, and M. Izutsu, "Asymptotic formalism for ultraflat optical frequency comb generation using a Mach-Zehnder modulator," Opt. Lett. 32, 1515-1517 (2007).

Dudley, J. M., Genty, G., Coen, Stephane, "Supercontinuum generation in photonic crystal fiber," Rev. Mod. Phys. 78, 1135-1184 (2006).

Li, J., Yi, X., Lee, H., Diddams, S., and Vahala, K., "Electro-optical frequency division and stable microwave synthesis," Science 345, 309-313 (2014).

Geng, J., Staines, S., and Jiang, S., "Dual-frequency Brillouin fiber laser for optical generation of tunable low-noise radio frequency/microwave frequency," Opt. Lett. 33, 16-18 (2008).

Pan, S., and Yao, J., "A wavelength-switchable single-longitudinal-mode dual-wavelength erbium-doped fiber laser for switchable microwave generation," Opt. Express 17, 5414-5419 (2009).

Taylor, J., Datta, S., Hati, A., Nelson, C., Quinlan, F., Joshi, A., and Diddams, S., "Characterization of Power-to-Phase Conversion in High-Speed P-I-N Photodiodes," IEEE Photonics Journal 3, 140 (2011).

A. J. Seeds, K. J. Williams, J., Lightwave Technol. 24, 4628-4641 (2006).

J. Yao, J. Lightwave Technol. 27, 314-335 (2009).

G. Carpintero et al., Opt. Lett. 37, 3657-3659 (2012).

E. N. Ivanov, S. A. Diddams, L. Hollberg, IEEE Trans. Ultrason. Ferroelectr. Freq. Control 52, 1068-1074 (2005).

Jiang Li, Hansuek Lee, and Kerry J. Vahala; "Low-noise Brillouin laser on a chip at 1064 nm"; Optics Letters vol. 39 pp. 287-290 (2014).

S. P. Smith, F. Zarinetchi, and S. Ezekiel; "Narrow-linewidth stimulated Brillouin fiber laser and applications"; Opt. Lett. vol. 16 pp. 393-395 (1991).

J. Geng, Staines, S., Z. Wang, J. Zong, M. Blake, and S. Jiang; "Highly stable low-noise Brillouin fiber laser with ultranarrow spectral linewidth;" IEEE Photonics Technology Letters vol. 18 pp. 1813-1815 (2006).

A. Debut, S. Randoux, and J. Zemmouri; "Linewidth narrowing in Brillouin lasers: theoretical analysis"; Phys. Rev. A62 023803 (2000).

Y. G. Shee, M. A. Mandi, M. H. Al-Mansoori, S. Yaakob, R. Mohamed, A. K. Zamzuri, A. Man, A. Ismail, and S. Hitam; "All-optical generation of a 21 GHz microwave carrier by incorporating a double-Brillouin frequency shifter"; Opt. Lett. vol. 35 pp. 1461-1463 (2010).

Y. G. Shee, M. H. Al-Mansoori, S. Yaakob, A. Man, A. K. Zamzuri, F. R. Mahamd Adikan, and M. A. Mandi; "Millimeter wave carrier generation based on a double-Brillouin-frequency spaced fiber laser"; Opt. Express vol. 20 pp. 13402-13408 (2012).

Co-owned U.S. Appl. No. 14/605,977, filed Jan. 26, 2015.

Co-owned U.S. Appl. No. 14/640,031, filed Mar. 6, 2015.

Kippenberg et al. "Fabrication and coupling to planar high-Q silica disk microcavities" Applied Physics Letters; Jul. 28, 2003; vol. 83; No. 4; pp. 797-799.

Non-Final Office Action for U.S. Appl. No. 13/525,147, filed Jun. 15, 2012 on behalf of Jiang Li, et al.; Mail Date: Jan. 13, 2015. 26 pages.

Notice of Allowance for U.S. Appl. No. 13/525,147, filed Jun. 15, 2012 on behalf of Jiang Li, et al.; Mail Date: Sep. 10, 2015. 11 pages.

Notice of Allowance for U.S. Appl. No. 13/525,147, filed Jun. 15, 2012 on behalf of Jiang Li, et al.; Mail Date: Nov. 12, 2015. 13 pages.

Non-Final Office Action for U.S. Appl. No. 14/513,058, filed Oct. 13, 2014 on behalf of Jiang Li, et al.; Mail Date: Nov. 25, 2014. 9 pages.

Notice of Allowance for U.S. Appl. No. 13/831,692, filed Mar. 15, 2013 on behalf of Kerry Vahala, et al.; Mail Date: Mar. 31, 2014. 8 pages.

Notice of Allowance for U.S. Appl. No. 14/605,977, filed Jan. 26, 2015 on behalf of Kerry Vahala, et al.; Mail Date: May 13, 2016. 18 pages.

\* cited by examiner

DUAL-FREQUENCY OPTICAL SOURCE

BENEFIT CLAIMS TO RELATED APPLICATIONS

This application claims benefit of (i) U.S. provisional App. No. 61/931,060 entitled "Cascaded Optical Divider and Microwave Synthesizer" filed Jan. 24, 2014 in the names of Kerry Vahala, Scott Diddams, Jiang Li, Xu Yi, and Hansuek Lee, and (ii) U.S. provisional App. No. 61/982,749 entitled "Dual SBS Lasers as Frequency References for Stable Microwave Generation by Optical Frequency Division" filed Apr. 22, 2014 in the names of Jiang Li and Kerry Vahala. Both of said provisional applications are hereby incorporated by reference as if fully set forth herein.

STATEMENT REGARDING FEDERALLY SPONSORED RESEARCH

This invention was made with government support under Grant No. FA9550-10-1-0284 awarded by the Air Force, under Grant No. PHY1225565 awarded by the National Science Foundation, and under Grant No. W31P4Q-14-1-0001 awarded by the U.S. Army Aviation and Missile Research, Development, and Engineering Center. The government has certain rights in the invention.

FIELD OF THE INVENTION

The field of the present invention relates to generating dual optical-frequency signals and dual-frequency optical sources. In particular, apparatus and methods are described herein for generating dual optical-frequency signals exhibiting enhanced difference-frequency stability and reduced phase noise.

BACKGROUND

Subject matter disclosed or claimed herein may be related to subject matter disclosed in:

L. Goldberg, H. F. Taylor, J. F. Weller, and D. M. Bloom, "Microwave signal generation with injection locked laser diodes," Electron. Lett. 19, 491-493 (1983);

Pillet, G., Morvan, L., Brunel, M., Bretenaker, F., Dolfi, D., Vallet, M., Huignard, J.-P., and Le Floch, A., "Dual frequency laser at 1.5 µm for optical distribution and generation of high-purity microwave signals," J. Lightwave Technol. 26, 2764-2773 (2008);

Schneider, G. J., Murakowski, J. A., Schuetz, C. A., Shi, S., and Prather, D. W., "Radio frequency signal-generation system with over seven octaves of continuous tuning," Nat. Photon. 7, 118-122 (2013);

Li, J., Lee, H., and Vahala., K.J., "Microwave synthesizer using an on-chip Brillouin oscillator," Nat. Commun. 4, 2097 (2013);

Fortier, T., et al., "Generation of ultrastable microwaves via optical frequency division," Nat. Photon. 5, 425-429 (2011);

H. Murata, A. Morimoto, T. Kobayashi, and S. Yamamoto, "Optical Pulse Generation by Electrooptic-Modulation Method and Its Application to Integrated Ultrashort Pulse Generators," IEEE J. Sel. Top. Quantum Electron. 6, 1325 (2000);

M. Fujiwara, J. Kani, H. Suzuki, K. Araya, M. Teshima, "Flattened optical multicarrier generation of 12.5 GHz spaced 256 channels based on sinusoidal amplitude and phase hybrid modulation," IEEE Electron. Lett. 37, 967-968 (2001);

A. J. Metcalf, V. Torres-Company, D. E. Leaird, and A. M. Weiner, "High-power broadly tunable electro-optic frequency comb generator," IEEE J. Sel. Top. Quantum Electron. 19, 3500306 (2013);

A. Rolland, G. Loas, M. Brunel, L. Frein, M. Vallet, and M. Alouini, "Non-linear optoelectronic phase-locked loop for stabilization of opto-millimeter waves: towards a narrow linewidth tunable THz source," Opt. Express 19, 17944-17950 (2011);

William C. Swann, Esther Baumann, Fabrizio R. Giorgetta, and Nathan R. Newbury, "Microwave generation with low residual phase noise from a femtosecond fiber laser with an intracavity electro-optic modulator," Opt. Express 19, 24387-24395 (2011);

Papp, S. B., Beha, K., DelHaye, P., Quinlan, F., Lee, H., Vahala, K. J., Diddams, S. A., "A microresonator frequency comb optical clock," arXiv: 1309.3525 (2013);

C. B. Huang, S. G. Park, D. E. Leaird, and A. M. Weiner, "Nonlinearly broadened phase-modulated continuous-wave laser frequency combs characterized using DPSK decoding," Opt. Express 16, 2520-2527 (2008);

I. Morohashi, T. Sakamoto, H. Sotobayashi, T. Kawanishi, and I. Hosako, "Broadband wavelength-tunable ultra-short pulse source using a Mach-Zehnder modulator and dispersion-flattened dispersion-decreasing fiber," Opt. Lett. 34, 2297-2299 (2009);

A. Ishizawa, T. Nishikawa, A. Mizutori, H. Takara, A. Takada, T. Sogawa, and M. Koga, "Phase-noise characteristics of a 25-GHz-spaced optical frequency comb based on a phase- and intensity-modulated laser," Opt. Express 21, 29186-29194 (2013);

S. Suzuki, K. Kashiwagi, Y. Tanaka, Y. Okuyama, T. Kotani, J. Nishikawa, H. Suto, M. Tamura, and T. Kurokawa, "12.5 GHz Near-IR Frequency Comb Generation Using Optical Pulse Synthesizer for Extra-Solar Planet Finder," in Nonlinear Optics, OSA Technical Digest: Nonlinear Optics Conference (Optical Society of America, 2013), paper NM3A.3;

Young, B., Cruz, F., Itano, W., and Bergquist, J., "Visible Lasers with Subhertz Linewidths," Phys. Rev. Lett. 82, 3799-3802 (1999);

T. Kessler, C. Hagemann, C. Grebing, T. Legero, U. Sterr, F. Riehle, M. J. Martin, L. Chen, and J. Ye., "A sub-40-mHz-linewidth laser based on a silicon single-crystal optical cavity," Nat. Photon. 6, 687-692 (2012);

Lee, H., Chen, T., Li, J., Yang, K. Y., Jeon, S., Painter, O., and Vahala, K. J., "Chemically etched ultrahigh-Q wedge resonator on a silicon chip," Nat. Photon. 6, 369-373 (2012);

Li, J., Lee, H., Chen, T., and Vahala, K. J., "Characterization of a high coherence, brillouin microcavity laser on silicon," Opt. Express 20, 20170-20180 (2012);

J. Li, H. Lee, K. Y. Yang, and K. J. Vahala, "Sideband spectroscopy and dispersion measurement in microcavities," Opt. Exp. 20, 26337-26344 (2012);

Dreyer, R., Hall, J. L., Kowalski, F., Hough, J., Ford, G., Munley, A., and Ward, H., "Laser phase and frequency stabilization using an optical resonator," Appl. Phys. B 31, 97-105 (1983);

Gross, M. C., Callahan, P. T., Clark, T. R., Novak, D., Waterhouse, R. B., and Dennis, M. L., "Tunable millimeter-wave frequency synthesis up to 100 GHz by dual-wavelength Brillouin fiber laser," Opt. Express 18, 13321-13330 (2010);

Callahan, P. T., Gross, M. C., and Dennis, M. L., "Frequency-independent phase noise in a dual-wavelength Brillouin fiber laser," IEEE J. Quantum Electron. 47, 1142-1150 (2011);

T. Sakamoto, T. Kawanishi, and M. Izutsu, "Asymptotic formalism for ultraflat optical frequency comb generation using a Mach-Zehnder modulator," Opt. Lett. 32, 1515-1517 (2007);

Dudley, J. M., Genty, G., Coen, Stephane, "Supercontinuum generation in photonic crystal fiber," Rev. Mod. Phys. 78, 1135-1184 (2006);

Li, J., Yi, X., Lee, H., Diddams, S., and Vahala, K., "Electro-optical frequency division and stable microwave synthesis," Science 345, 309-313;

Geng, J., Staines, S., and Jiang, S., "Dual-frequency Brillouin fiber laser for optical generation of tunable low-noise radio frequency/microwave frequency," Opt. Lett. 33, 16-18 (2008);

Pan, S., and Yao, J., "A wavelength-switchable single-longitudinal-mode dual-wavelength erbium-doped fiber laser for switchable microwave generation," Opt. Express 17, 5414-5419 (2009);

Taylor, J., Datta, S., Hati, A., Nelson, C., Quinlan, F., Joshi, A., and Diddams, S., "Characterization of Power-to-Phase Conversion in High-Speed P-I-N Photodiodes," IEEE Photonics Journal 3, 140 (2011);

A. J. Seeds, K. J. Williams, J., Lightwave Technol. 24, 4628-4641 (2006).

J. Yao, J. Lightwave Technol. 27, 314-335 (2009);

G. Carpintero et al., Opt. Lett. 37, 3657-3659 (2012);

U. L. Rohde, Microwave and Wireless Synthesizers: Theory and Design (Wiley, New York, 1997);

E. N. Ivanov, S. A. Diddams, L. Hollberg, IEEE Trans. Ultrason. Ferroelectr. Freq. Control 52, 1068-1074 (2005); and J. Li, H. Lee, K. J. Vahala, Opt. Lett. 39, 287-290 (2014).

Each of the references listed above is incorporated by reference as if fully set forth herein.

SUMMARY

A dual-frequency optical source comprises: (a) first and second pump laser sources arranged to generate optical pump power at respective first and second pump laser frequencies $v_{pump1}$ and $v_{pump2}$; and (b) a fiber optical resonator characterized by a Brillouin shift frequency $v_B$ and a free spectral range that is substantially equal to an integer submultiple of the Brillouin shift frequency. Each one of the first and second pump laser sources is frequency-locked to a corresponding resonant optical mode of the fiber optical resonator. First and second optical output signals of the dual-frequency optical reference source at respective first and second output frequencies $v_1 = v_{pump1} - v_B$ and $v_2 = v_{pump2} - v_B$ comprise stimulated Brillouin laser output generated by simultaneous optical pumping of the fiber optical resonator by the first and second pump laser sources, respectively. An output difference frequency $v_2 - v_1$ is greater than about 300 GHz.

Using the dual-frequency optical source, a method for generating first and second optical output signals comprises simultaneously pumping the fiber optical resonator with optical pump power from the first and second pump laser sources.

Objects and advantages pertaining to microwave-frequency sources and dual-frequency optical sources, and methods for their use, may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
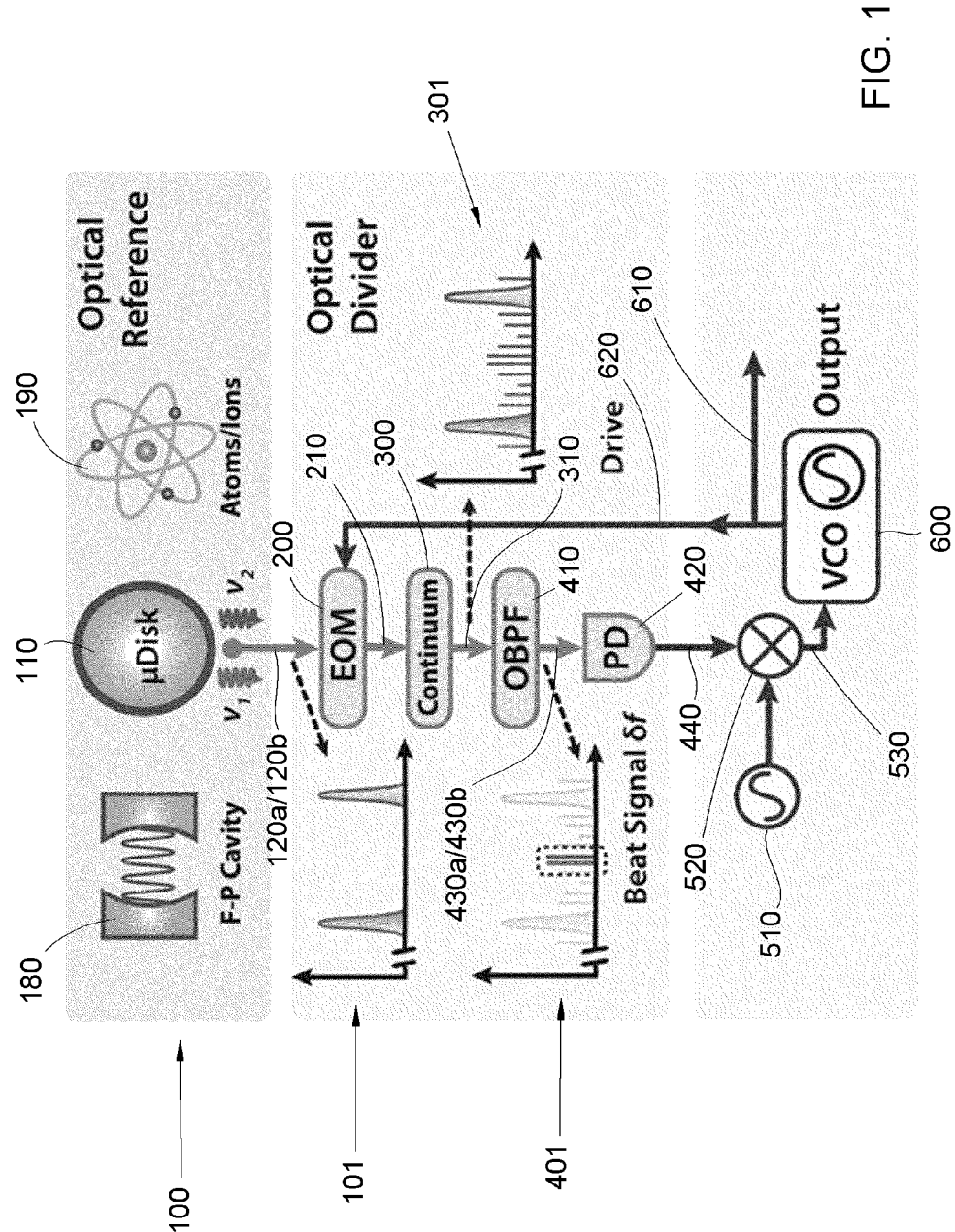
FIG. 1 illustrates schematically an inventive microwave-frequency source.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Microwave- and radio-frequency oscillators are widely used in communications, remote sensing, navigation, radar, scientific measurements, computers, clocks, time standards, and in other areas. They provide a single electrical frequency that can often be controllably tuned. Their performance is characterized using various metrics including power output, frequency tuning range, and frequency stability. The last of these metrics, frequency stability, is crucial to most applications, and the cost of an oscillator is directly related to the level of frequency stability that it provides. The very highest performance oscillators have typically been based on electrical oscillators that employ high-Q dielectric resonators to create a highly stable frequency. Optical detection of two highly coherent laser signals is another well-known approach to generate a stable radio-frequency or microwave-frequency signal; two optical signals coincident on an optical detector (i.e., a photodetector) and having a frequency difference within the detection frequency bandwidth of the optical detector produce an electrical output signal from the optical detector at the optical difference frequency of the optical signals, also referred to as a beat note or a beat frequency. A newer approach developed over the last few years employs a revolutionary, all-optical approach to microwave synthesis using a device known as a frequency-comb optical divider (or simply "optical divider"). Optical dividers accept as an input a highly coherent optical signal that oscillates at 100s of THz. This is normally a laser signal that has been stabilized by an optical reference cavity. This very high input frequency is divided down to a rate in the radio-frequency or microwave-frequency range (100s of MHz or 100s of GHz) using the optical divider. This division process is accompanied by a dramatic reduction of the phase noise in the final signal relative to the initial optical signal thereby endowing the radio/microwave signal with remarkable (and record) stability. The frequency-comb optical divider employs a special mode locked laser to achieve this reduction.

Disclosed herein are novel, inventive apparatus and methods for achieving optical frequency division and stable operation of a microwave-frequency signal provided by an electrical oscillator having a frequency control input (sometimes called a voltage-controlled oscillator, or VCO). This novel approach is described herein along with preliminary measurements that demonstrate the feasibility of the method. In the inventive approach two reference optical signals, provided by lasers, are frequency-stabilized so that the relative frequency of the lasers (i.e., their difference frequency) is as stable as possible (or practicable to achieve performance necessary for a given use or application, i.e., relatively stabilized within an operationally acceptable reference bandwidth). The laser signals are then phase modulated using a cascade of phase modulators that are driven by the VCO. In the optical spectrum, this creates a spectrum of sidebands on the initial laser frequencies spaced by the modulation frequency. The phase-modulated optical signals can be spectrally broadened to further increase number of sidebands in the side-band frequency spectrum, using an intensity modulator, a dispersion compensator, an optical amplifier (if needed or desired), and a nonlinear optical medium. It is desirable for the frequency separation of the lasers be as large as practicable (for a given use or application) to provide the maximum practicable stabilization of the VCO. However, the frequency separation cannot exceed the range of sidebands generated by the phase modulation cascade (and nonlinear optical broadening, if employed). The two innermost sidebands (see FIG. 3) must be close enough in frequency so that a beat frequency between them can be detected using a photodiode. As described further below, the photodiode signal contains phase information arising from the VCO and is used to stabilize the VCO. The inventive method has already enabled generation of highly stable microwave-frequency signals having a phase noise level well below a high performance electrical oscillator at offset frequencies of 10 kHz and 100 kHz. The performance of the inventive method can be substantially improved by further increasing the frequency separation of the two reference optical signals. In examples disclosed herein these reference optical signals are provided by dual pumping of a single high-Q disk resonator to produce stimulated Brillouin oscillation at two distinct wavelengths. The frequency separation is limited by the ability to pump separate lines efficiently within the same cavity, as is discussed further below. Other dual optical-frequency reference sources can be employed, e.g., a reference source comprising two lasers frequency-locked to separate modes of a single reference resonator cavity.

Compared to a conventional frequency-comb optical divider, the inventive method disclosed herein has not yet attained the same, record frequency stability. However, improvements in pulse-broadening methods described above should result in performance improvements beyond those already demonstrated, since phase noise is reduced by the square of the division ratio and larger difference frequency results in a larger division ratio. Also, offsetting the current performance limitation, the inventive approach does not require a mode-locked frequency comb generator, which is a sophisticated and costly device. Instead, the inventive method employs relatively simpler and less costly optical components, most of which are available commercially. Also, in many examples the reference frequency (i.e., the difference frequency of two optical sources) depends on the relative stability of two resonances within a single resonator. This is, in principle, a more robust reference as technical noise in the system (i.e., arising from instabilities in equipment, as opposed to quantum noise inherent in the physics of the system) is common to both resonances and therefore largely cancelled-out in the difference frequency. In contrast, the conventional divider approach relies upon an absolute reference frequency, which is more strongly impacted by technical noise. The principle of operation of the inventive optical frequency divider disclosed herein is also different in that the repetition frequency (i.e., sideband spacing) is set by an electrical VCO as opposed to an optical cavity. As a result it is possible to tune the microwave frequency of the output signal, which is not readily achieved with a conventional frequency-comb optical divider. Also, the conventional frequency-comb divider approach relies upon optical detection of a train of high peak power pulses of light with high bandwidth. The linearity of the photodetection process has been shown to be crucial to attaining frequency stability using this approach and greatly restricts the types of optical detectors that may be employed. In contrast the present invention can employ lower-bandwidth optical detectors or detectors with relaxed linearity requirements.

The inventive apparatus and methods disclosed herein for achieving optical frequency division for high-performance microwave-frequency signal generation employ cascaded phase modulation comprising direct phase modulation and also self-phase modulation (if needed or desired to achieve larger division ratios than can be achieve using direct phase modulation alone). In contrast to a comb of spectral lines produced by a mode-locked laser, cascaded phase modulators do not have an intrinsic repetition frequency since there is no optical cavity. While this can endow the cascade-generated comb of sidebands with an arbitrarily chosen line spacing frequency, it also means that optical frequency division must be accomplished in a fashion different from that used with conventional frequency combs.

Figure 2:
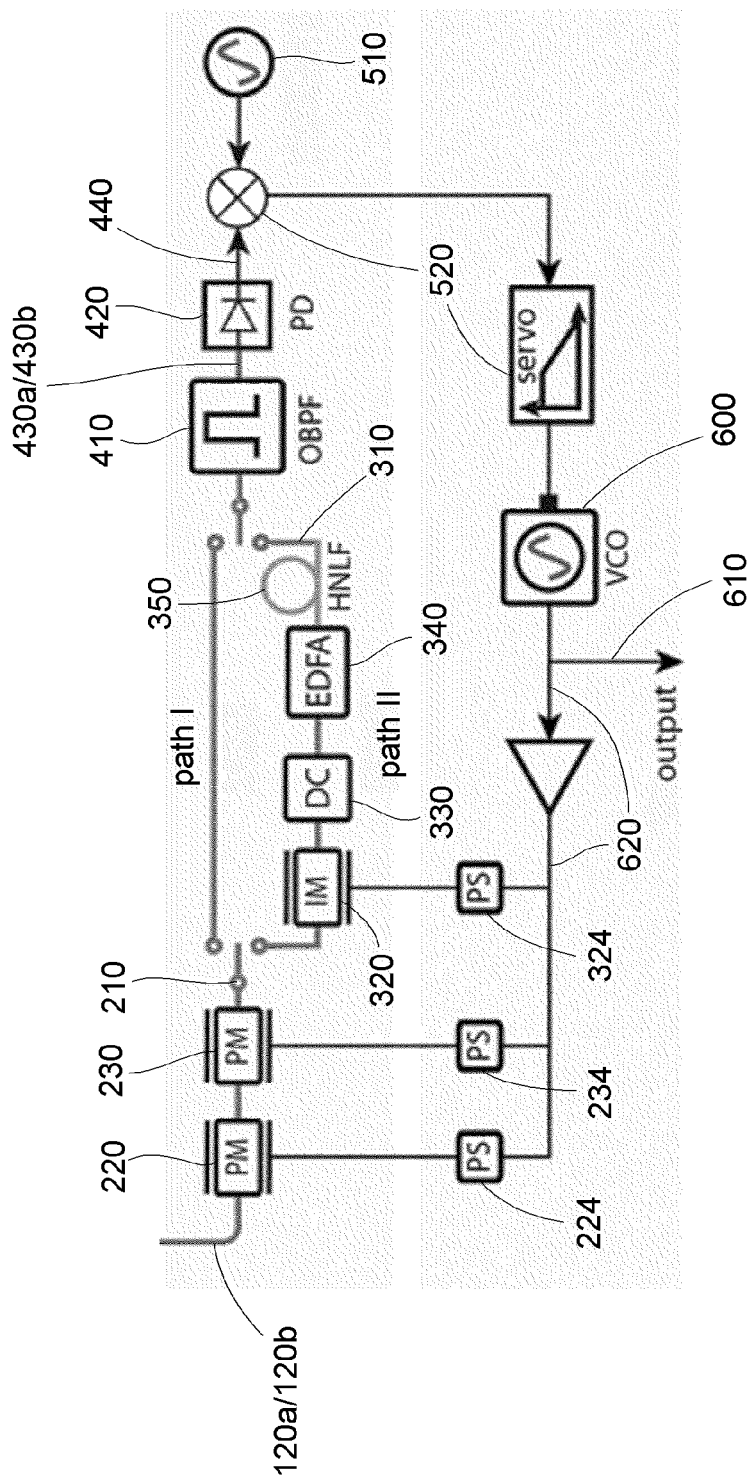
FIG. 2 illustrates schematically an inventive electro-optic frequency divider coupled to a voltage-controlled oscillator in a phase-locked loop arrangement.
Figure 3:
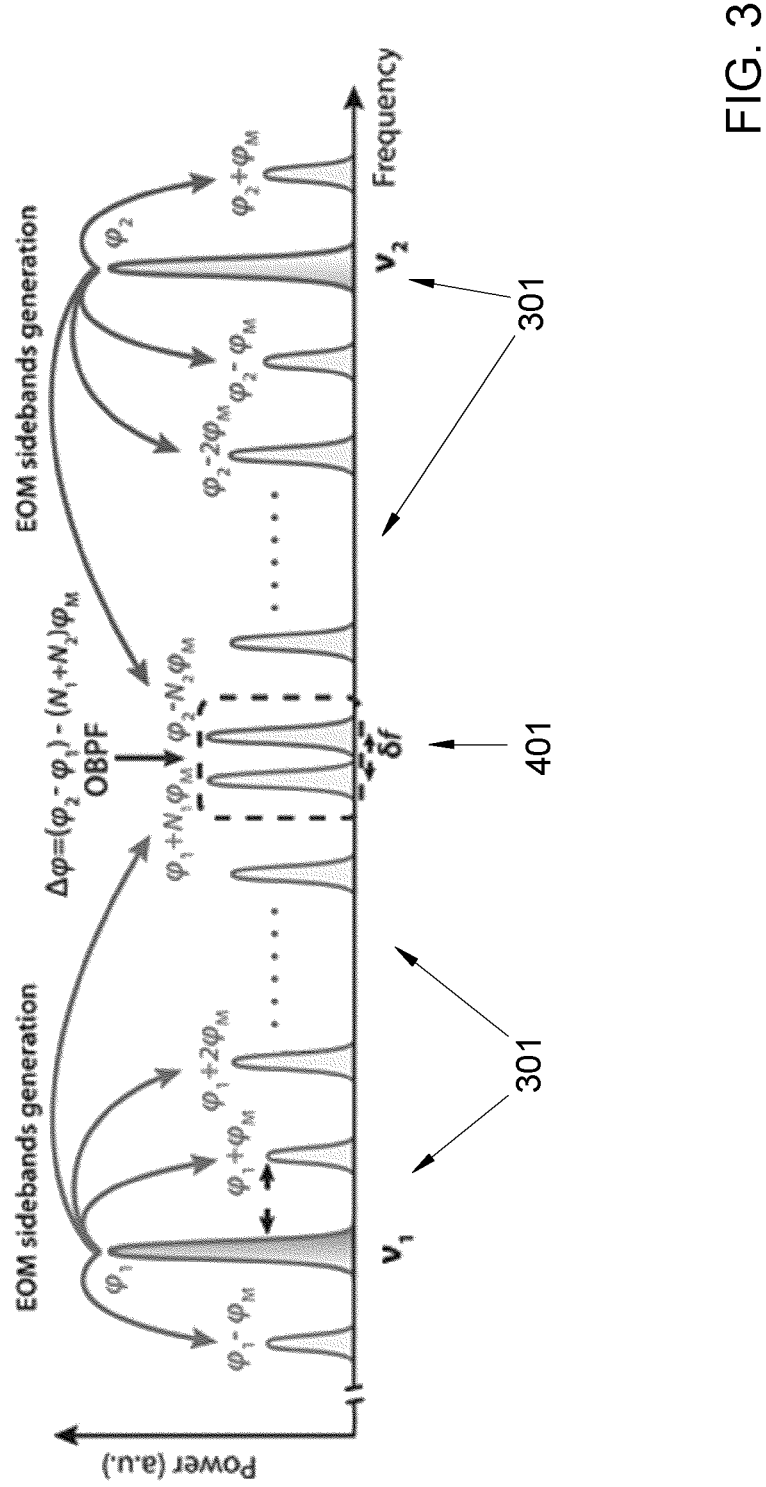
FIG. 3 is a simulated optical spectrum including multiple sideband optical signals.
Figure 7:
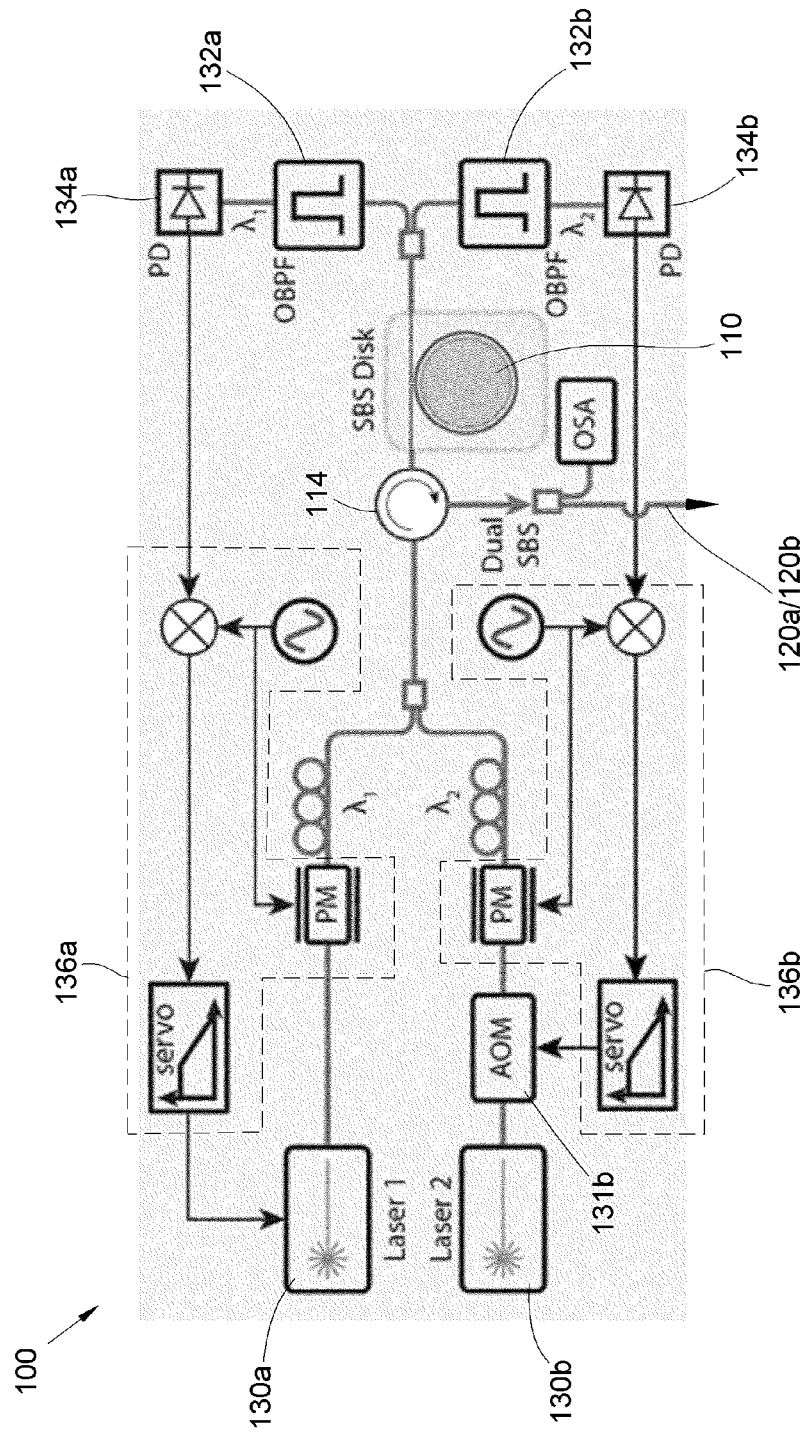
FIG. 7 illustrates schematically an inventive dual-frequency optical source.
Figure 8:
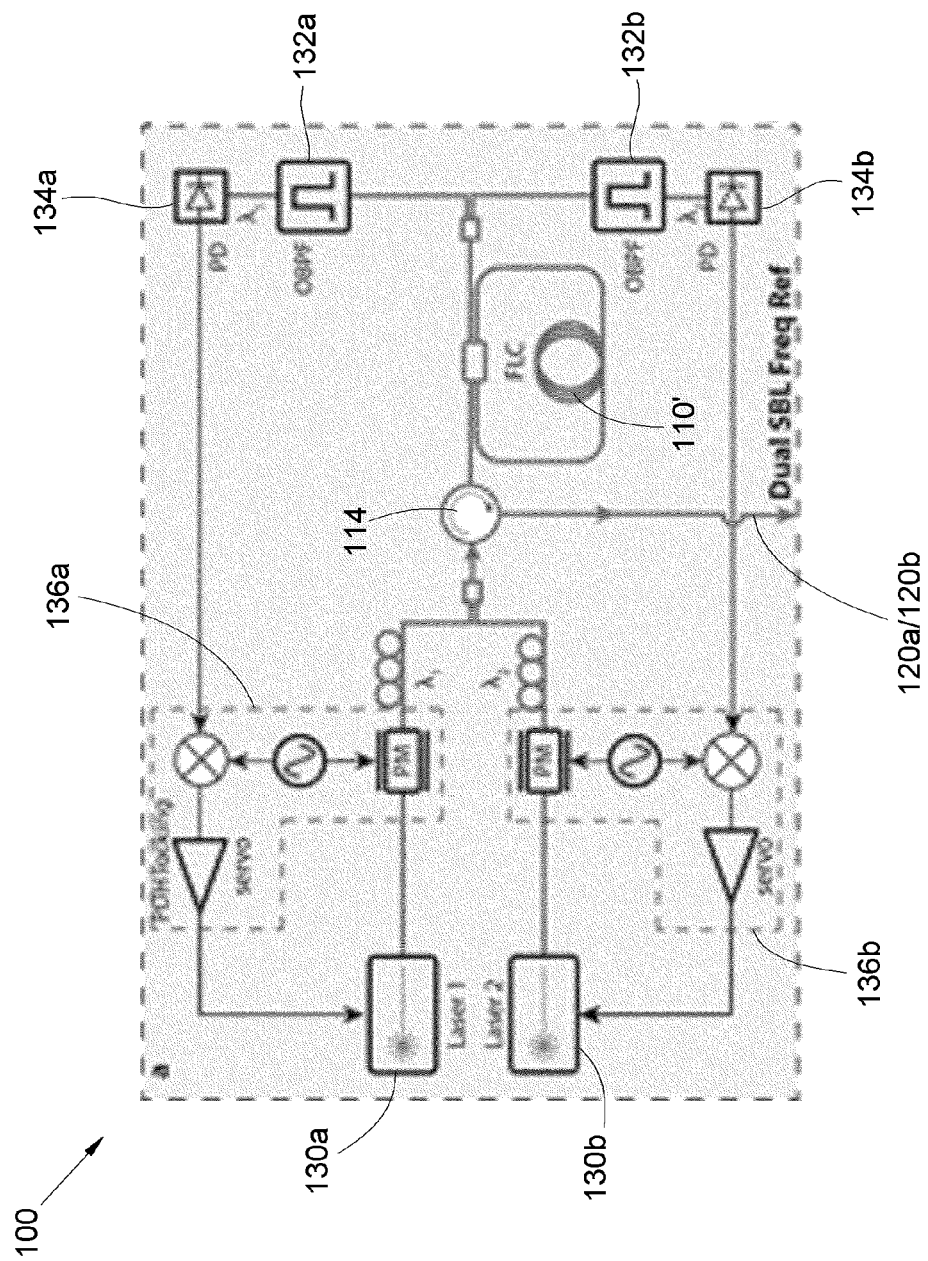
FIG. 8 illustrates schematically another inventive dual-frequency optical source.

FIGS. 1-3 illustrate the inventive approach in which two laser lines having sufficiently good (i.e., operationally acceptable) relative frequency stability provide two optical reference signals 120$a$/120$b$ (characterized by spectrum 101) for the microwave-frequency source. FIG. 1 is a high-level block diagram of the system; FIG. 2 includes further details of certain elements of the system; FIG. 3 is a schematic representation of the frequency spectrum of the optical signals relevant to the inventive approach. In some examples (described below), the two laser lines 120$a$/120$b$ are produced by concomitant Brillouin oscillation in a single high-Q microcavity 110 or fiber-loop cavity 110' (FLC) pumped by two corresponding, independent pump lasers 130$a$/130$b$ (FIGS. 7 and 8, discussed further below). Alternatively, the two laser lines 120$a$/120$b$ could also be produced by a dual-mode laser, by frequency-locking two lasers to distinct optical modes of a single, common reference cavity 180, or by frequency-locking to distinct atomic transitions 190. The two reference laser lines enter the electro-optic frequency divider (i.e., an electro-optic sideband generator) where they are phase modulated by a pair of modulators 220 at a frequency $f_M$ set by a voltage-controlled electrical oscillator 600 (VCO). The sideband spectrum 301 created by the phase modulators 220 can be further broadened by pulse-forming and self-phase phase modulation in an optical fiber 350. The multiple sideband optical signals thus formed extend from each laser line 120a/120b and results in a pair of sidebands optical signals 430a/430b (typically near the mid-point of the difference frequency span; see spectrum 401). The sideband optical signals 430a/430b are optically filtered and detected using a photodiode 420. As discussed below, the beat note signal generated by the two detected sideband signals 430a/430b contains the phase noise of the VCO 600 magnified by the optical division factor ($N_1+N_2$), the number of sidebands needed to get to the sidebands signals 430a/430b). The beat note therefore provides a suitable error signal for phase-lock-loop control of the VCO 600.

Figure 4:
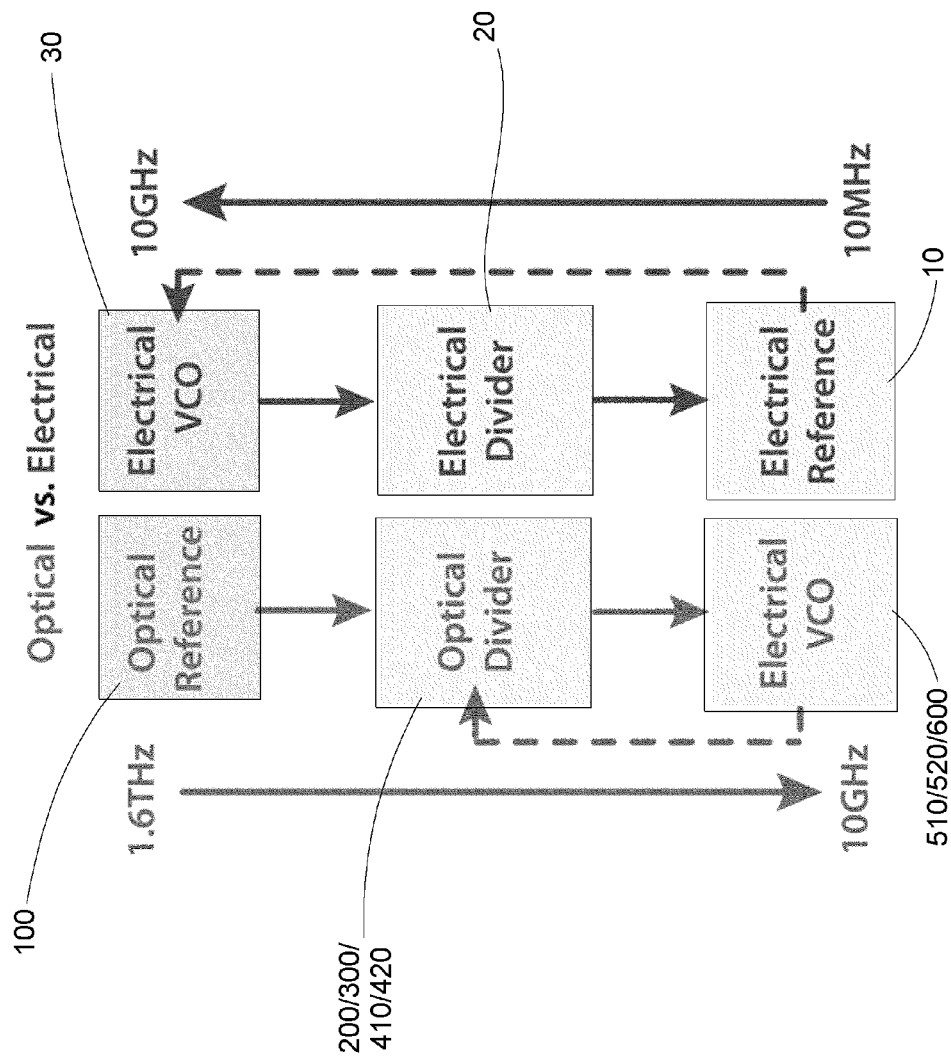
FIG. 4 contrasts an inventive optical frequency divider and a conventional electrical frequency divider.

It is interesting to contrast the inventive microwave-frequency source with a more conventional microwave-frequency source employing a frequency reference 10 and a VCO 30. In the conventional approach (see FIG. 4), the VCO 30 provides the highest frequency in the system. It is stabilized by electrical frequency division 20 and phase comparison to a lower-frequency reference oscillator 10, such as a quartz oscillator. In contrast, the inventive electro-optic frequency divider disclosed herein operates by reversing the positions of the reference and the VCO in the frequency domain. Specifically, the reference 100 is provided by the relative frequency separation of the laser lines; that frequency separation is made many times greater than the frequency of the VCO 600 (in the present implementation this typically is a non-detectable rate using an optical detector). Moreover, the reference frequency is divided down to the VCO frequency (in the inventive source) as opposed to dividing the VCO frequency down to the reference frequency rate (as in the conventional source). By making this reversal, the inventive device benefits from (i) the stability of optical oscillators, which now typically exceeds that of microwave oscillators, and (ii) the power of optical frequency division to transfer the stability to the microwave domain. Also, because the inventive divider derives its rate from the electrical VCO 600, it is continuously tunable. In particular, the frequency output is set by the tuning range of the electrical VCO and the frequency separation of the reference laser lines and not fixed by a cavity repetition rate.

The use of a frequency separation as opposed to an absolute frequency to derive a reference for microwave generation has been demonstrated using conventional mode-locked laser frequency combs. In those types of devices the frequency-comb optical divider is implemented by locking a comb at two frequencies of a reference cavity. As in other conventional optical dividers, detection of the comb provides a divided-down signal, in this case of the frequency separation of the reference cavity modes. This two-point lock approach has also been implemented previously in using two atomic lines and a frequency microcomb.

FIG. 3 illustrates the origin of the phase noise reduction provided by the inventive frequency divider. The accumulated phase noise contributions in the generated sideband optical signals are tracked from the two laser sources to the phase difference of the detected sidebands generating the detectable beat note. The detected beat note is compared to a reference oscillator signal. By adjusting the phase of the VCO 600 to nullify the phase difference, $\Delta\phi$, the resulting VCO fluctuations are reduced to the following value: $\phi^2_M = (\phi_1-\phi_2)^2/(N_1+N_2)^2$; correlations in the phase noise of the two laser sources (arising, for example, from common-mode technical noise) are cancelled in this approach. The ultimate lower limit of the relative phase noise of the VCO 600 is given by the optical phase noise of the laser lines reduced by the division factor squared (i.e., reduced by a factor of $(N_1+N_2)^2$). Clearly, to reduce phase noise of the electrical VCO 600, the laser frequency separation (i.e., difference frequency) should be made as large as possible (or practicable for a given use or application, i.e., operationally acceptable). In a preferred embodiment of the inventive system, this magnitude of the difference frequency is determined by the span of the dual-pumped Brillouin lasers.

An example of a dual optical-frequency reference source is shown in more detail in FIG. 7. The optical reference laser signals 120a/120b are provided by Brillouin laser lines co-lasing within a single silica-on-silicon high-Q disk resonator 110. The coherence properties of the individual Brillouin laser lines is excellent, and the relative frequency stability of the Brillouin laser lines is enhanced by co-lasing within a common resonator. In the inventive microwave-frequency source the Brillouin laser lines are separated by a difference frequency sufficiently large that a dual pump configuration is needed. In this example the silica disk resonator 110 is designed and fabricated with a free-spectral-range (FSR) of about 10.890 GHz that substantially matches the Brillouin shift frequency in silica at a pump wavelength of 1550 nm. Other needed, desired, or suitable materials can be employed that exhibit different Brillouin shift frequencies. Each pump laser 130a/130b (emitting at corresponding wavelengths $\lambda_1$ and $\lambda_2$) is frequency-locked to a corresponding distinct resonant optical mode of the disk resonator 110 using the Pound-Drever-Hall (PDH) technique, is coupled into the disk resonator 110 through a circulator 114, and excites its own corresponding Brillouin laser in the backward-propagating direction at respective optical reference frequencies $v_1$ and $v_2$. The PDH technique is implemented for each pump laser 130a/130b by employing respective optical bandpass filters 132a/132b, photodetectors 134a/134b, and feedback/servo mechanisms 136a/136b; control of each pump wavelength can be via direct laser control (as with pump laser 130a) or via frequency shifting of the laser output (as with acousto-optic shifting of the output of pump laser 130b). The frequency separation (i.e., the difference frequency $v_2-v_1$) between the two SBS lasers can be readily tuned by tuning the pump lasers 130a/130b to pump at resonator modes with different azimuthal mode orders. FIG. 8 shows a similar example wherein the disk resonator 110 has been replaced by a fiber-loop optical resonator 110' (i.e., a fiber-loop cavity or FLC).

Figure 5A:
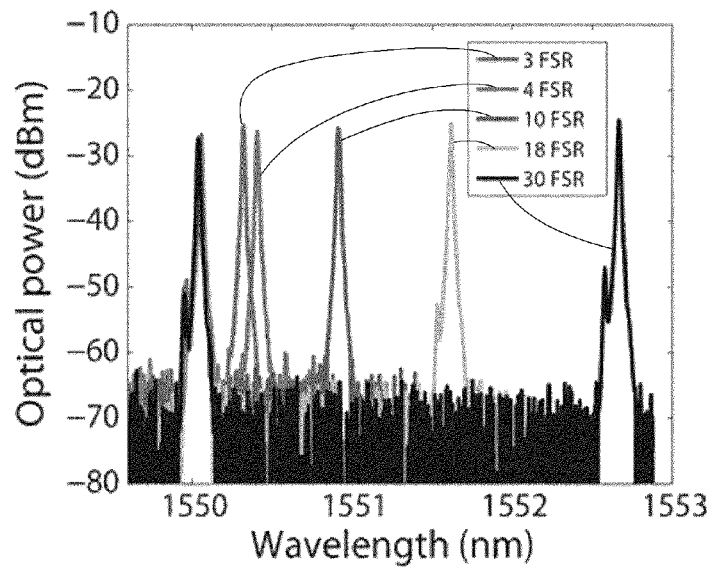
FIGS. 5A-5E are plots of measured spectra and noise of an inventive microwave-frequency source.

Dual pumping of fiber-based SBS lasers in a single, common FLC previously has been applied to generate stable microwave-frequency signals by conventional optical detection of the optical signals, with the two pump laser wavelengths being the sidebands of a single continuous-wave (CW) laser generated by electro-optic phase modulation at the desired microwave frequency. In that previous arrangement the two SBS laser frequencies are by necessity sufficiently close in frequency that their difference frequency (i.e., beat note) is directly detectable using an optical detector. In contrast, in the inventive arrangement the SBS laser frequencies $v_2$ and $v_1$ are separated at much larger frequency separations (e.g., 109, 198, 327, and 1612 GHz in various experiments, by dual pumping on disk resonator optical modes separated by 10, 18, 30 and 148 cavity FSR using independently tunable CW lasers). These increasing frequency separations increase the phase noise reduction by optical frequency division by increasing division factors; it is therefore desirable that the frequency separation (i.e., the difference frequency $v_2-v_1$) be made as large as possible or practicable. Such large frequency separations are typically so large that it is not possible to optically detect the difference frequency (i.e., the beat note) because it greatly exceeds the detection bandwidth of optical detectors. The maximum separation of 1612 GHz in embodiments constructed thus far is limited by one of the SBS pump lasers being at 1537 nm, near the edge of the gain bandwidth of the erbium-doped fiber amplifier employed; other pump sources can be employed to achieve greater spectral separation of the optical reference signals 120a/120b. Measured optical spectra of the dual SBS lines at some of these spectral separations is shown in FIG. 5A. It is worth noting that the two SBS laser signals 120a/120b share not only the single, common chip-based disk resonator 110, but also the same fiber-optic pathway throughout the subsequent optical/electrical conversion, thereby suppressing path length variation effects.

Figure 5B:
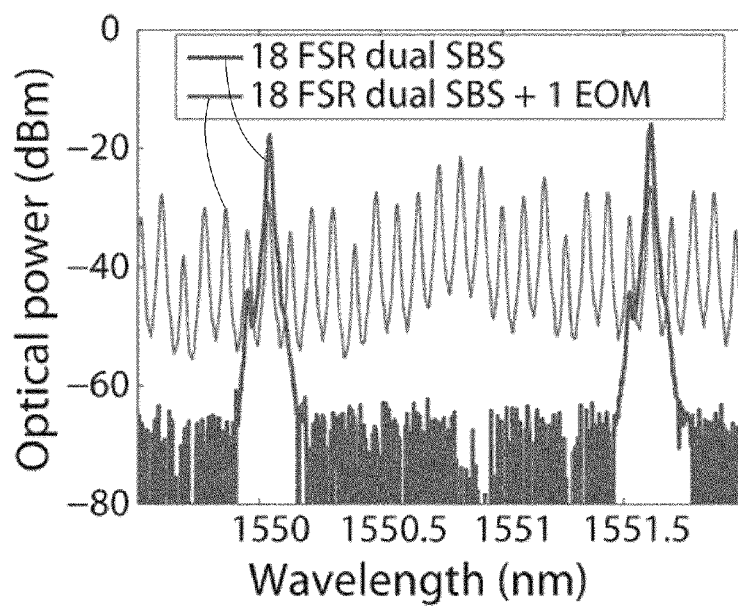

In the examples of FIGS. 7 and 8, the optical reference signals 120a/120b are coupled to the optical divider section using a circulator 114. In order to generate multiple sideband optical signals 310, the sideband generator 200 is employed that comprises two phase modulators 220/230 with relatively low $V_\pi$~3.9V (at 12 GHz) are cascaded and phase synchronized with corresponding RF phase shifters 224/234 (FIGS. 1 and 2). The phase modulators 220/230 are driven at 32.5 dBm and 30.7 dBm, corresponding to a total phase modulation amplitude up to about $6\pi(\approx\pi V_{drive}/V_\pi)$, which is also approximately equal to half of the number of sidebands produced by the modulators 220/230. The drive signal to the phase modulators 220/230 (i.e., the sideband generator input electrical signal) is a portion 620 of the output electrical signal of the VCO 600 at a frequency $f_M$ (acting as a sideband generator input optical signal). In one example, up to about 30 electro-optic-modulated (EOM) sidebands (i.e., $N_1+N_2$ up to about 30) can be generated using only a first portion 200 of the sideband generator (i.e., using only phase modulators 220/230 for generating the sideband signals 310; path I in FIG. 2), resulting in a difference frequency $v_2-v_1$ of up to about 327 GHz and optical division by a factor of up to about 30. A measured optical spectrum showing both the original SBS laser lines (18 FSR frequency separation) and the resulting phase modulation sidebands is shown in FIG. 5B. With frequency division by 30, the phase noise of the microwave-frequency signal 610 will be reduced by about a factor of about 900, relative to phase noise of the difference frequency of the optical reference signals 120a/120b, by feedback stabilization of the frequency $f_M$ (described further below). Two phase modulators are employed in the example shown in FIG. 2; however, a single phase modulator can be employed if it provides sufficiently large modulation to produce sufficiently many sidebands.

To further enhance the sideband spectral width, additional phase modulators can be used, or phase modulators providing larger phase modulation amplitude can be used. Alternatively, or in addition, so-called continuum generation (e.g., as described in the publications of Huang et al (2008), Morohashi et al (2009), Ishizawa et al (2013, and Suzuki et al (2013), incorporated above) can be employed (path II in FIG. 2) by employing a second portion 300 of the sideband generator. That portion comprises an intensity modulator 320 (driven at frequency $f_M$ by a portion of the VCO signal 620 and synchronized using a phase shifter 324), a dispersion compensator 330, an optical amplifier 340, and a nonlinear optical medium 350. In a typical example, the intensity modulator 320 can comprise an electro-optic Mach-Zehnder interferometer, the dispersion compensator 330 can comprise a suitable length of suitably dispersive optical fiber (e.g., dispersion-shifted optical fiber or an optical fiber including a dispersion-shifting grating), the optical amplifier 340 can comprise an erbium-doped optical fiber amplifier (EDFA), and the nonlinear optical medium 350 can comprise a suitable length of highly nonlinear optical fiber (HNLF). Other functionally equivalent components can be employed, e.g., an electroabsorption modulator. In this example, continuum generation, cascaded with the phase modulators 220/230, can generate sufficiently many sidebands to enable the two reference optical signals 120a/120b to be spaced farther apart spectrally than is typically possible using phase modulators alone; in this example, a difference frequency $v_2-v_1$ can be generated up to 148 FSR of the disk resonator 110 (i.e., up to about 1.6 THz apart in this example; $N_1-N_2$ up to 148; limited by the gain bandwidth of the EDFA, as noted above). With frequency division by 148, the phase noise of the microwave-frequency signal 610 will be reduced by about a factor of over 20,000 relative to phase noise of the optical reference signals 120a/120b by feedback stabilization of the frequency $f_M$ (described further below). Even greater reduction of phase noise can be achieved by using even larger difference frequencies The two transmitted optical sidebands 430a/430b (at respective frequencies $v_1+N_1f_M$ and $v_2-N_2f_M$, separated by $\delta f$ that is typically $\ll f_M$) are transmitted by the optical bandpass filter 410 and are detected using an amplified optical detector 420 (125 MHz bandwidth in this example). Linear superposition of those transmitted sideband signals results in a signal incident on the optical detector 420 that produces an optical detector electrical signal at the beat note frequency $f_{BEAT}=(v_2-N_2f_M)-(v_1+N_1f_M)$. A reference oscillator 510 generates a reference oscillator electrical signal at frequency $f_R$ (a quartz oscillator operating at about 10 MHz in this example; any suitable reference oscillator can be employed; frequencies $f_R$ from about 1 MHz to about 500 MHz have been employed). The phase noise contributed by the reference oscillator 510 is also reduced by the overall frequency division and does not present any limit on the phase noise reduction achievable by the optical frequency division process. An electrical circuit 520 compares the phases of the photodiode and reference electrical signals and generates an error signal (in any needed, desired, or suitable way), which is then loop-filtered by the circuit 520 (in any needed, desired, or suitable way). The loop-filtered error signal serves as a VCO electrical input signal 530 used for phase-locking the VCO 600 to a subharmonic (i.e., integer submultiple) of the frequency $v_2-v_1\pm f_R$. In the example the VCO comprises a microwave generator operated using the external FM modulation input mode; any suitable type or implementation of a VCO can be employed.

Figure 5C:
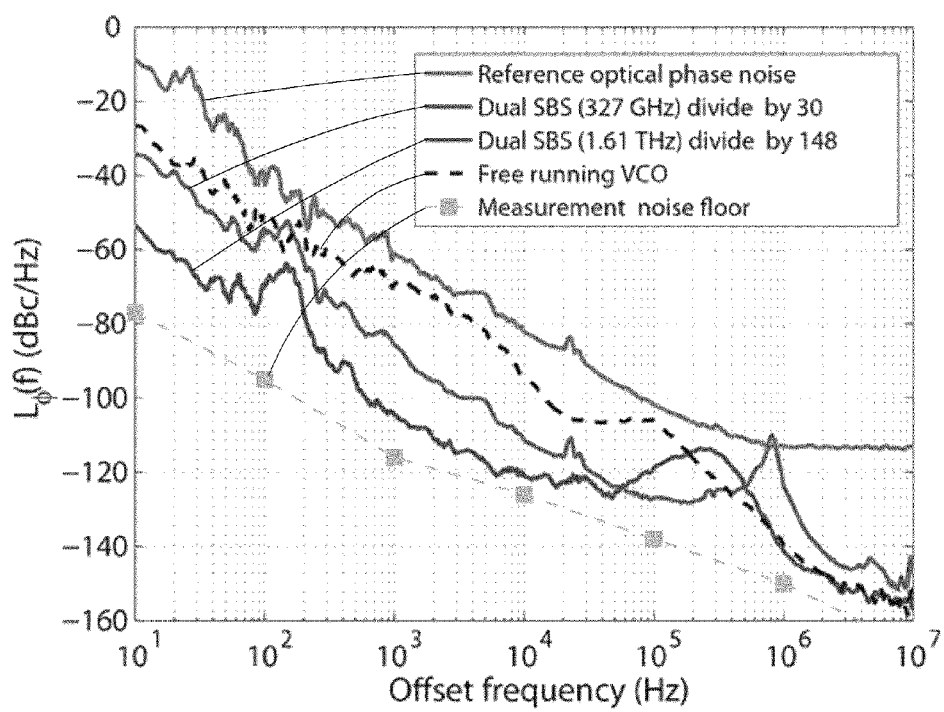

To establish the phase noise level of the Brillouin lasers (the phase noise reference level), the uppermost curve in FIG. 5C gives the single sideband (SSB) phase noise ($L_\phi$) of the beat note produced by optical detection of output of the example dual SBS lasers of FIG. 7 on a fast optical detector (50 GHz bandwidth). For that measurement the dual SBS laser signals are pumped at three FSR apart, resulting in a beat note at 32.7 GHz that is both detectable using an optical detector and can be analyzed by an electrical phase noise analyzer. The phase noise level has been shown to remain approximately constant with frequency tuning of the SBS laser frequencies and therefore provides a measure of the reference phase noise of the lasers even when they are tuned to very large (i.e., non-detectable) frequency separations used in the invention frequency division process. For offset frequencies (horizontal axis in, e.g., FIG. 5C) higher than 100 Hz the noise spectrum is limited by Schawlow-Townes noise, while at offset frequencies less than 100 Hz a technical noise component is present. In the current experiment this spectrum provides the reference noise level (invariant of frequency difference) that is reduced quadratically by the optical frequency division factor $N_1+N_2$. To test the optical divider, the VCO 600 is locked to the divided optical reference as shown in FIGS. 1-3 by feeding the loop-filtered error signal 530 into the VCO control/tuning input port. The lower two curves in FIG. 5C are the corresponding measured phase noise spectra of the VCO 600 at 10.89 GHz when optically dividing by 30 times (second lowest curve) and 148 times (lowest curve) relative to the initial frequency separation of the dual SBS lines 120a/120b. Decrease of the phase noise with the increase of the division ratio is clearly shown by the data. The frequency of the output signal 610 is held at 10.89 GHz in these measurements by adjusting the frequency separation of the Brillouin laser lines using the tunable pump laser sources 130a/130b. As an aside, the features in the phase noise spectra at around 900 kHz (division ratio of 30 achieved using path I in FIGS. 2) and 300 kHz (division ratio of 148 achieved using path II in FIG. 2) are the servo bumps in the phase-locked loop control circuitry. Those frequencies are determined by the servo loop delay, which includes optical and electrical path lengths and the tuning response of the VCO 600.

Figure 5D:
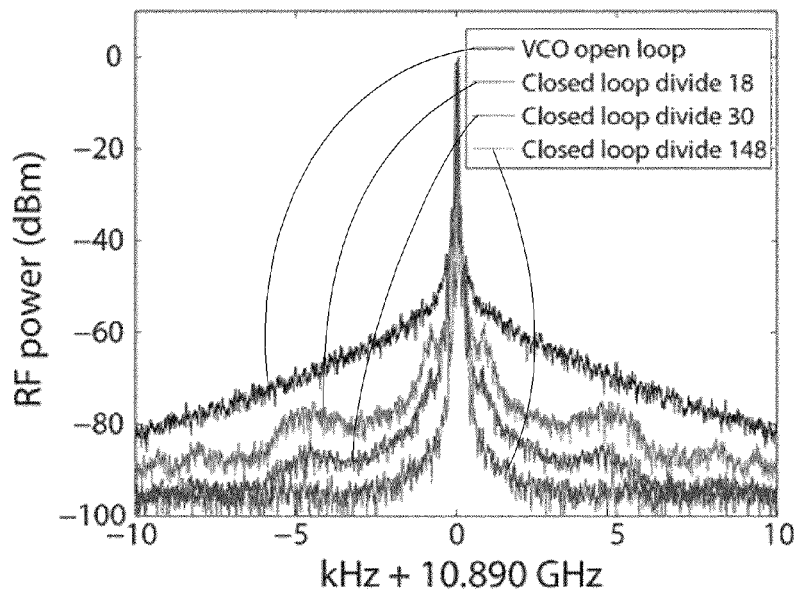
Figure 5E:
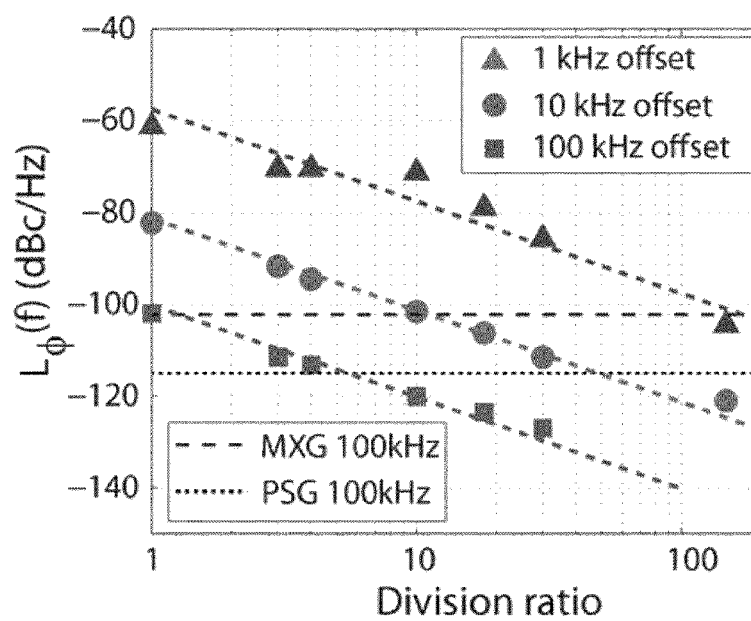

To illustrate the improvement in the performance of the VCO phase noise under phase-locked conditions, the dashed curve in FIG. 5C is the phase noise spectrum of the free running VCO 600. When dividing a 327 GHz Brillouin optical difference frequency a factor of 30 (path I in FIG. 2; phase modulators 220/230 only), a phase noise reduction of around 20 dB for offset frequencies between 1 kHz and 100 kHz relative to the original free running VCO 600 is observed, and a phase noise level of −112 dBc/Hz at 10 kHz offset frequency and −127 dBc/Hz at 100 kHz offset frequency is achieved for the 10.89 GHz carrier. When dividing the 1.61 THz Brillouin optical signal difference frequency by a factor of 148 (path II in FIG. 2; phase modulators plus continuum generation), the achieved phase noise level for the 10.89 GHz carrier is −104 dBc/Hz at 1 kHz offset frequency, −121 dBc/Hz at 10 kHz offset frequency, and −119 dBc/Hz at 100 kHz offset frequency. The rise of the phase noise at 100 kHz offset for 148 division ratio is because this offset is close to the servo peak at 300 kHz (servo bandwidth). FIG. 5D shows the measured spectra of the VCO output 610 at 10.89 GHz (20 kHz span and 30 Hz resolution bandwidth settings on the electrical spectrum analyzer). The uppermost curve is the free running VCO spectrum, while the other spectra are, in descending order, the spectra of the phase-locked VCO 600 when dividing down 18, 30 and 148 times, respectively, from corresponding SBS frequency separations of 196, 327 GHz and 1.61 THz. FIG. 5E summarizes these results by giving the measured phase noise at 1 kHz, 10 kHz and 100 kHz offset frequencies plotted versus division ratios of 1, 3, 4, 10, 18, 30 and 148. The dashed lines give the $1/(N_1+N_2)^2$ fits and are in good agreement with the measured values. For comparison, the upper horizontal dashed line is the phase noise of an Agilent MXG microwave synthesizer (carrier 11 GHz, offset 100 kHz, Agilent online data sheet, Literature number 5989-7572EN), and the lower horizontal dashed line is the phase noise of a high performance Agilent PSG microwave synthesizer (carrier 11 GHz, offset 100 kHz, Agilent online data Sheet, Literature number 5989-0698EN, option UNX).

Figure 6A:
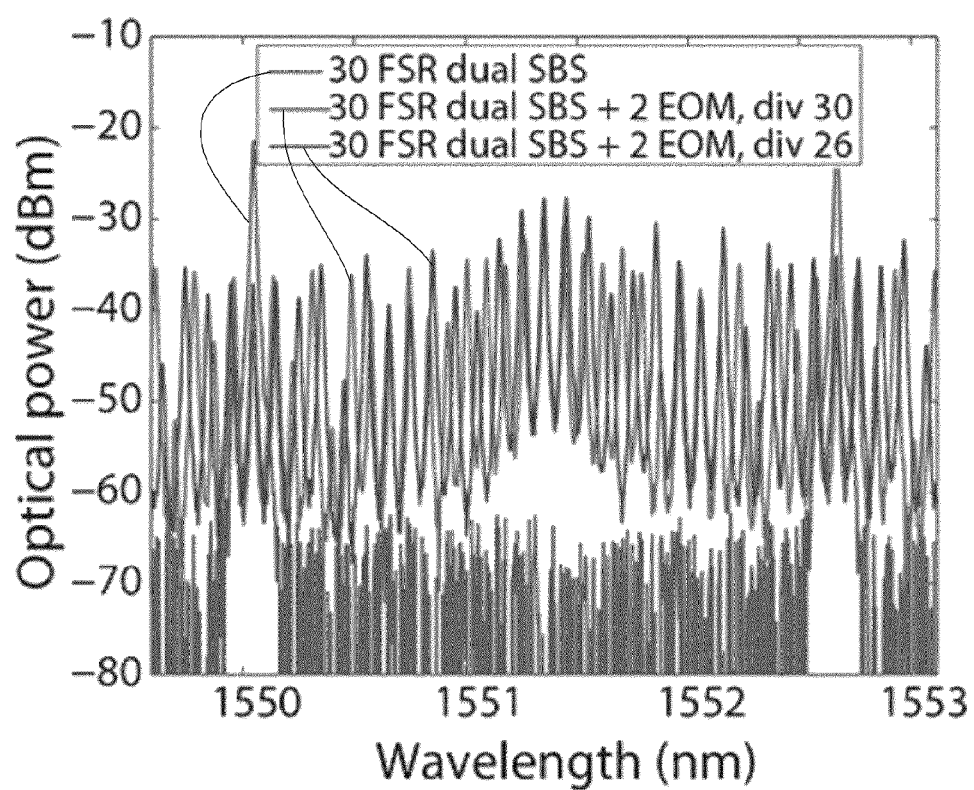
FIGS. 6A-6C are plots of measured spectra of an inventive microwave-frequency source.
Figure 6B:
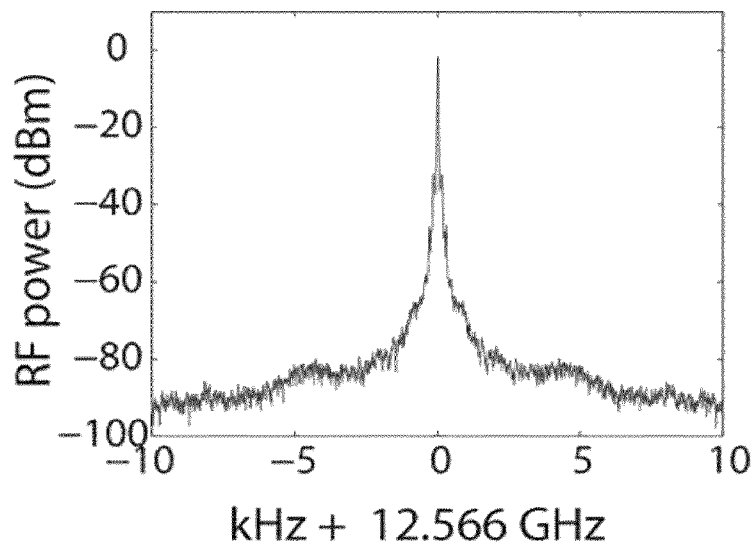
Figure 6C:
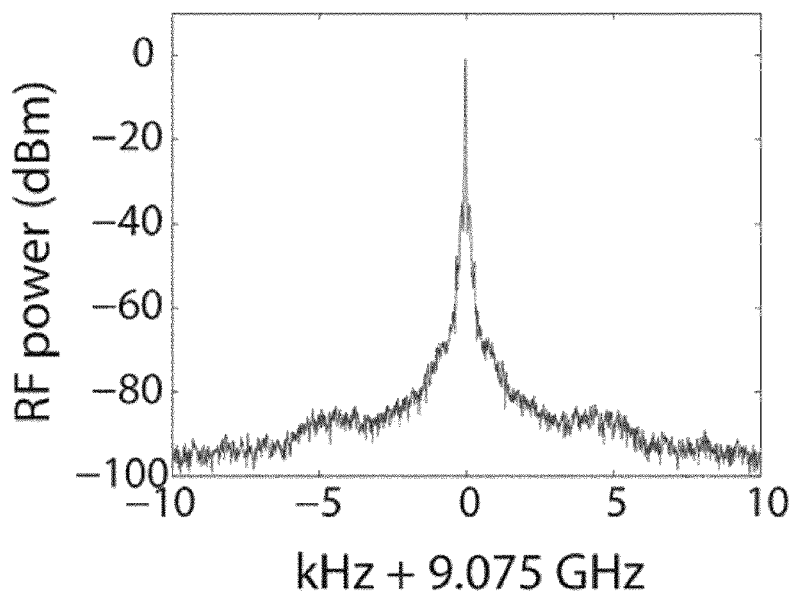

In the examples shown so far the microwave frequency $f_M$ has been fixed; however, that frequency can be adjusted by varying the division ratio. Specifically, by changing the division ratio $N_1$–$N_2$ and VCO frequency $f_M$ for a fixed separation of the dual SBS lines $v_2$–$v_1$, phase locked frequency synthesis of different carrier frequencies (e.g., $f_M = (v_1-v_2 \pm f_R)/(N_1+N_2)$) is possible. For example, in FIG. 6A the sideband frequencies nearly overlap at the midpoint for two different division ratios 26 and 30. The only requirement is for the difference frequency $v_2$–$v_1$ to be approximately equal to an integer multiple of the desired output/modulation frequency $f_M$. FIG. 6B shows the measured noise spectrum of a phase-locked 12.566 GHz output signal 610, while FIG. 6C shows the measured noise spectrum of an output signal 610 at 9.075 GHz. Moreover, the initial reference frequency separation $v_2$–$v_1$ also can be tuned. Employing multiple reference cavities 110 or 180 having varying FSRs enables a wide range of output frequencies can be generated using a single divider.

Referring to FIGS. 1 and 2, a microwave-frequency source is arranged for generating an output electrical signal at an output frequency $f_M$, and comprises: (a) a dual optical-frequency reference source 100; (b) an electro-optic sideband generator 200/300; (c) an optical bandpass filter 410; (d) an optical detector 420; (e) a reference oscillator 510; (f) an electrical circuit 520; and (g) a voltage-controlled electrical oscillator 600. The dual optical-frequency reference source 100 is arranged so as to generate (i) a first optical reference signal 120a at a first optical reference frequency $v_1$ and (ii) a second optical reference signal 120b at a second optical reference frequency $v_2 > v_1$. An example of a spectrum 101 of the first and second optical reference signals 120a/120b is represented schematically in an inset of FIG. 1. The electro-optic sideband generator 200/300 is arranged so as to (i) receive the first and second optical reference signals 120a/120b and a sideband generator input electrical signal at the frequency $f_M$ and (ii) generate therefrom multiple sideband optical signals 210/310 at respective sideband optical frequencies of the form $v_1 \pm n_1 f_M$ and $v_2 \pm n_2 f_M$, wherein $n_1$ and $n_2$ are integers. An example of a spectrum 301 of the multiple sideband optical signals 310 is represented schematically in an inset of FIG. 1 and also in FIG. 3. The optical bandpass filter 410 is arranged so as to transmit a subset of the multiple sideband optical signals 210/310 including the sideband optical signal 430a at a frequency $v_1+N_1 f_M$ and the sideband optical signal 430b at a frequency $v_2-N_2 f_M$ (separated by $\delta f$, that typically is $\ll f_M$). An example of a spectrum 401 of the transmitted sideband optical signals 430a/430b is represented schematically in an inset of FIG. 1 and also in FIG. 3. The optical detector 420 is arranged so as to (i) receive the transmitted sideband optical signals 430a/430b and (ii) generate an optical detector electrical signal 440 at a beat frequency $f_{BEAT} = (v_2-N_2 f_M)-(v_1+N_1 f_M)$.

The reference oscillator 510 is arranged so as to generate a reference oscillator electrical signal at a reference oscillator frequency $f_R$. The electrical circuit 520 is arranged so as to (i) receive the optical detector electrical signal 440 and the reference oscillator electrical signal, (ii) generate therefrom, using a comparator portion of the electrical circuit 520, an electrical error signal dependent on relative phase of the optical detector and reference oscillator electrical signals, and (iii) process the electrical error signal using a loop-filter portion of the electrical circuit 520. The voltage-controlled electrical oscillator 600 is arranged so as to (i)

receive the loop-filtered electrical error signal 530 as a VCO input electrical signal and (ii) generate a VCO output electrical signal at the frequency $f_M$, wherein a first portion 620 of the VCO output electrical signal is received by the electro-optic sideband generator 200/300 as the sideband generator input electrical signal and a second portion 610 of the VCO output electrical signal forms the output electrical signal of the microwave-frequency source. Reception of the first portion 620 of the VCO output electrical signal by the electro-optic sideband generator 200/300 as the sideband generator input electrical signal results in the electrical circuit 520 and the voltage-controlled oscillator 600 being coupled in a negative feedback arrangement so as to function as a phase-locked loop (PLL). Comparator and loop-filter portions of the electrical circuit 520 can be implemented in any needed, desired, or suitable way.

A method for generating the microwave-frequency output electrical signal 610 at the output frequency $f_M$ comprises: (a) generating the first and second optical reference signals 120a/120b using the dual optical-frequency reference source 100; (b) generating the multiple sideband optical signals 210/310 using the electro-optic sideband generator 200/300; (c) transmitting the sideband optical signals 430a/430b using the optical bandpass filter 420; (d) generating the optical detector electrical signal 440 using an optical detector 420; (e) generating the reference oscillator electrical signal using the reference oscillator 510; (f) generating the loop-filtered electrical error signal 530 using the electrical circuit 520; and (g) using the voltage-controlled electrical oscillator 600 to generate the VCO output electrical signal 610/620. Reception of the first portion 620 of the VCO output electrical signal by the electro-optic sideband generator 200/300 as the sideband generator input electrical signal results in the electrical circuit 520 and the voltage-controlled oscillator 600 being coupled in a negative feedback arrangement so as to function as a phase-locked loop.

The output frequency $f_M$ can lie anywhere within the so-called microwave portion of the electromagnetic spectrum, e.g., between about 0.3 GHz and about 300 GHz. In some examples the output frequency $f_M$ is between about 1 GHz and about 100 GHz.

As illustrated schematically in FIG. 3, the electro-optic sideband generator 200/300 acts to divide the difference frequency $v_2-v_1$ by a factor of $N_1+N_2$, resulting in a pair of sidebands optical signals 430a/430b (at respective frequencies $v_1+N_1 f_M$ and $v_2-N_2 f_M$) that are spectrally close enough together to both fall within the passband of the optical bandpass filter 410. The electro-optic sideband generator 200/300 can therefore be referred to as an electro-optic frequency divider (EOFD). Division of the difference frequency $v_2-v_1$ by a factor of $N_1+N_2$, coupled with phase-locking the electro-optic sideband generator 200/300 and the voltage controlled oscillator 600, results in reduction of phase noise of the output electrical signal 610 of the microwave-frequency source by a factor of about $(N_1+N_2)^2$, relative to phase noise of the dual optical-frequency reference source 100.

It is therefore advantageous to increase the division ratio to reduce phase noise of the generated microwave-frequency electrical signal. One way to achieve a higher division ratio is to increase the reference difference frequency $v_2-v_1$. In some examples, the reference difference frequency $v_2-v_1$ is greater than about 100 GHz. In some of those examples, the reference difference frequency $v_2-v_1$ is greater than about 1 THz, greater than 10 THz, or greater than 100 THz. Still larger reference difference frequencies can be employed as needed, desired, or suitable, or as suitable optical sources are developed or become available.

Depending on the reference difference frequency $v_2-v_1$ and the desired output frequency $f_M$, any suitable division ratio $N_1+N_2$ can be employed. In some examples the division ratio $N_1+N_2$ is greater than or equal to 10, greater than or equal to 50, greater than or equal to 100, or greater than or equal to 1000. As noted above, a greater division ratio provides greater reduction of phase noise.

The reference optical signals 120a/120b can be provided at any needed, desired, or suitable optical frequencies. In some examples the, first and second optical reference frequencies $v_1$ and $v_2$ are each between about 75 THz and about 750 THz (i.e., wavelengths between about 400 nm and about 4 μm), between about 120 THz and about 430 THz (i.e., wavelengths between about 700 nm and about 2.5 μm), or between about 150 THz and about 300 THz (i.e., between about 1 μm and about 2 μm). The latter two ranges can be convenient due to ready availability of fiber-optic and/or solid state sources in those wavelength regions. Other wavelengths can be employed.

In some examples, the reference oscillator frequency and the beat frequency can be between about 1 MHz and about 500 MHz, between about 5 MHz and about 100 MHz, or between about 10 MHz and about 50 MHz. In some examples, the reference oscillator 510 comprises a crystal oscillator, e.g., a quartz oscillator. In some other examples, the reference oscillator 510 comprises an electrical oscillator, e.g., a frequency-synthesized oscillator. Any suitably stable reference oscillator can be employed that provides sufficiently stable (i.e., operationally acceptable) performance of the microwave-frequency source in a given use or application.

In some examples, the dual optical-frequency reference source 100 is stabilized so as to maintain fluctuations of a reference difference frequency $v_2-v_1$ (i.e., relative frequency stability of the lasers) within an operationally acceptable optical reference bandwidth. In some examples, the operationally acceptable reference bandwidth (given as a bandwidth characterized over a given time interval) is less than about 100 Hz over about a 1 second timescale, or less than about 1 Hz over about a 1 second timescale. In some examples, the operationally acceptable reference bandwidth (given as optical phase noise at a given offset frequency relative to the optical carrier frequency) is about −40 dBc/Hz at 100 Hz offset frequency and about −80 dBc/Hz at 10 kHz offset frequency, or about −80 dBc/Hz at 100 Hz offset frequency and about −125 dBc/Hz at 10 kHz offset frequency. Generally, improved levels of relative stability of the laser sources will translate directly into improvements in the overall frequency stability of the microwave-frequency output signal. Still better stabilized references can be employed as needed, desired, or suitable, or as suitable optical sources are developed or become available.

As noted above, in some examples the dual optical-frequency reference source 100 comprises first and second pump laser sources 130a/130b and an optical resonator 110 (a disk resonator; FIG. 7) or 110' (a fiber-loop resonator; FIG. 8). The free spectral range (FSR) of the optical resonator 110/110' is substantially equal to an integer submultiple of a Brillouin shift frequency of the optical resonator. In some examples, the optical resonator comprises silica and the Brillouin shift frequency of the optical resonator is about 10.9 GHz; other needed, desired, or suitable materials can be employed that exhibit different Brillouin shift frequencies. Each one of the first and second pump laser sources 120a/120b is frequency-locked to a corresponding resonant optical mode of the optical resonator 110/110'. The first and second optical reference signals 120a/120b comprise stimulated Brillouin laser (SBL) output generated by optical pumping of the optical resonator simultaneously by the first and second pump laser sources 130a/130b, respectively. In some examples, the free spectral range of the optical resonator 110/110' is substantially equal to the Brillouin shift frequency of the optical resonator. In some examples, the optical resonator comprises a ring optical resonator such as a disk optical resonator 110 (as in FIG. 7). In other examples, the optical resonator comprises a fiber optical resonator, such as a fiber-loop optical resonator 110' (as in FIG. 8) or a linear, Fabry-Perot-type fiber optical resonator (which can include, e.g., fiber Bragg gratings at the pump frequency or the SBL frequency). In some examples, each one of the first and second pump laser sources is frequency-locked to the corresponding resonant optical mode of the resonator 110/110' by a Pound-Drever-Hall mechanism; any suitable mechanism can be employed, e.g., a Hänsch-Couillaud mechanism.

Instead of an optical resonator acting as a dual-pumped stimulated Brillouin laser (SBL), in some other examples the dual optical-frequency reference source 100 comprises a dual-mode laser source. In still other examples the dual optical-frequency reference source 100 comprises first and second reference laser sources that are each frequency-locked to a corresponding distinct resonant optical mode of a common optical reference cavity 180 (FIG. 1). In still other examples, the dual optical-frequency reference source 100 comprises first and second reference laser sources that are each frequency-locked to a corresponding distinct atomic transition 190 (FIG. 1). Any other suitable stabilized dual optical-frequency reference source can be employed that provides needed, desired, or suitable (i.e., operationally acceptable) reference frequencies and difference frequency stability.

As noted above, in some examples the electro-optic sideband generator comprises only two or more electro-optic phase modulators 220/230 (path I of FIG. 2) each driven by a corresponding portion of the sideband generator input electrical signal at the frequency $f_M$. The two or more phase modulators 220/230 (which form the portion 200 of the sideband generator) are arranged in series so as to sequentially transmit the first and second optical reference signals 120a/120b so as to generate the multiple optical sideband signals 310 at corresponding sideband optical frequencies of the form $v_1 \pm n_1 f_M$ and $v_2 \pm n_2 f_M$, wherein $n_1$ and $n_2$ are integers. Using the two phase modulators 220/230, pairs of sideband optical signals are generated with $n_1 + n_2$ ranging from 2 up to at least 30.

In other examples, the conventional technique of continuum generation is included in the portion 300 of the electro-optic sideband generator (path II of FIG. 2), which comprises the two or more electro-optic phase modulators 220/230, an intensity modulator 320, a dispersion compensator 330, an optical amplifier 340, and a nonlinear optical medium 350. The two or more electro-optic phase modulators 220/230 are each driven by a corresponding portion of the sideband generator input electrical signal at the frequency $f_M$, derived from the VCO output signal 620 and synchronized with phase shifters 224/234. The intensity modulator is driven by another portion of the sideband generator input electrical signal at the frequency $f_M$, derived from the VCO output signal 620 and synchronized with phase shifter 324. The phase modulators 220/230, the intensity modulator 320, the dispersion compensator 330, the optical amplifier 340, and the nonlinear optical medium 350 are arranged in series so as to sequentially, in order, transmit the first and second optical reference signals so as to generate the multiple optical sideband signals 310. Those signals are at corresponding frequencies of the form $v_1 \pm n_1 f_M$ and $v_2 \pm n_2 f_M$, wherein $n_1$ and $n_2$ are integers with $n_1 + n_2$ ranging from 2 up to at least 100 or more. Any needed, desired, or suitable combination of modulators, dispersion compensator, amplifier, and nonlinear medium can be employed. In some examples, the intensity modulator comprises an electro-optic Mach-Zehnder interferometer, the dispersion compensator 330 can comprise a suitable length of suitably dispersive optical fiber (e.g., dispersion-shifted optical fiber or an optical fiber including a dispersion-shifting grating), the optical amplifier 340 can comprise an erbium-doped optical fiber amplifier (EDFA), and the nonlinear optical medium 350 can comprise a suitable length of highly nonlinear optical fiber (HNLF). Other functionally equivalent components can be employed, e.g., an electroabsorption modulator. As suitable techniques for generating large phase amplitude modulation are developed or become available it may become possible to replace the above functions with fewer or even a single phase modulator.

As already noted, optical frequency division (OFD) now enables the generation of ultra-stable microwave-frequency signals with record low phase noise. A key ingredient for OFD is a stable optical frequency reference (OFR). Optical references can be of two types: an absolute frequency reference or a difference-frequency reference. The latter type of reference and is well suited for application with the optical frequency divider described herein. The inventive dual-frequency optical source illustrated schematically in FIGS. 7 and 8 will now be discussed in more detail. The dual-frequency optical source 100 is based on THz-bandwidth dual-mode stimulated Brillouin lasers (SBLs). The phase noise of the dual-mode SBL difference frequency reference is measured to be −105 dBc/Hz at 1 kHz offset when the frequency reference is set to a difference frequency directly-detectable with an optical detector (e.g., a few 10s GHz, perhaps 100 GHz). This is already an excellent phase noise level, representing a 15 dB improvement over previous Brillouin lasers. As a frequency reference, it is desirable to increase this difference frequency to very high (i.e., not directly detectable) values greater than about 300 GHz up to about 1 THz, about 5 THz, about 10 THz, about 100 THz, or even beyond 100 THz. Such an increase in difference frequency can be accomplished with little or no degradation in phase noise on account of the physics governing noise in the underlying Brillouin lasers. The phase noise of the dual mode SBL difference frequency is determined by the fundamental Schawlow-Townes frequency noise of the two lasers, which is approximately invariant with respect to the frequency separation between them. Using optical frequency division, such large difference frequency (not detectable using optical detectors) values can be divided down to a conventionally detectable frequency (e.g., 10s of GHz). As is well known, the phase noise of the difference frequency is reduced in the divided-down signal by the square of the division ratio. Given the already low phase noise of the difference frequency generated by the inventive dual-frequency source, the frequency-division-induced reduction of phase noise is predicted to enable record-low phase noise at microwave frequencies. The inventive difference-frequency reference can be generated using standard fiber-optic components and requires little or no costly hardware. It should therefore be easily transferable to many different uses and applications.

Key components for microwave-frequency signal generation using the OFD approach are the stable optical frequency reference and the optical frequency divider. An inventive electro-optic frequency divider was disclosed above. Conventional, stable optical frequency references used in various OFD approaches include cavity-stabilized lasers with sub-Hertz stability, or two lasers with exceptional relative frequency stability by frequency-locking to a single, common reference optical cavity 180 (FIG. 1). Those two methods require a well-isolated, high-finesse Fabry-Perot reference optical cavity, which typically is quite bulky and delicate. On the other hand, various types of dual-mode lasers have been used to generate microwave signals with good quality by optical detection of the dual mode lasers (also called dual wavelength lasers) on a fast optical detector and detecting the beat frequency of the laser signals. For instance, dual-mode stimulated Brillouin lasers, pumped by two lasers in a single fiber-loop cavity, have been used to generate microwaves from 10s MHz up to 100 GHz by optical detection. However, in those methods, the microwave-frequency signal is directly generated by beating of the dual optical modes of the laser on the optical detector, so the generated microwave-frequency signals are limited by the bandwidth of the optical detector (up to perhaps 100 GHz). Moreover, the phase noise of the microwave-frequency signal is equal to the phase noise of the relative frequency stability of the two laser modes.

In the inventive dual-frequency optical source 100, we transform the conventional role of the optically detected dual-mode lasers (bandwidth up to 100 GHz) to stable optical reference references, with much larger frequency separation in a range between about 300 GHz to about 100 THz or even higher. The reference difference frequency produced by the inventive dual-mode stimulated Brillouin lasers (SBL) can then be divided down to microwave frequencies using optical frequency dividers (such as the inventive electro-optic frequency divider described above, or a conventional mode-locked laser frequency comb). The phase noise of the generated microwave-frequency signal is also divided from that of the relative stability between the dual mode SBLs by $20\log_{10}N$ dB, where N is the division factor. The phase noise of the optically divided microwave-frequency signal can be greatly reduced relative to that of the dual-frequency optical-frequency reference, which as noted above has low phase noise itself. Optical frequency division is a relatively new approach to microwave generation. Frequency references, both absolute or difference-based, have typically used passive Fabry-Perot resonators, which are bulky and delicate devices.

As already described above and shown in FIGS. 7 and 8, an inventive dual-frequency optical source 100 comprises first and second pump laser sources 130a/130b and an optical resonator 110 (a disk resonator; FIG. 7) or 110' (a fiber-loop resonator; FIG. 8). The first and second pump laser sources arranged to generate optical pump power at respective first and second pump laser frequencies $v_{pump1}$ and $v_{pump}2$, corresponding to respective first and second pump wavelengths $\lambda_{pump1}$ and $\lambda_{pump2}$. The optical pump power is routed into the optical resonator 110/110' using a circulator 114; other suitable arrangements can be employed, e.g., a beamsplitter. The optical resonator 110/110' is characterized by a Brillouin shift frequency $v_B$ and a free spectral range (FSR) that is substantially equal to an integer submultiple of the Brillouin shift frequency. Each one of the first and second pump laser sources 130a/130b is frequency-locked to a corresponding resonant optical mode of the optical resonator 110/110'; any needed, desired, or suitable frequency-locking technique or mechanism can be employed. The first and second optical output signals 120a/120b of the dual-frequency optical reference source 100 at respective first and second output frequencies $v_1=v_{pump1}-v_B$ and $v_2=v_{pump2}-v_B$ comprise stimulated Brillouin laser output generated by simultaneous optical pumping of the optical resonator 110/110' by the first and second pump laser sources 120a/120b, respectively. The output signals 120a/120b are routed out of the dual-frequency source 100 using a circulator 114; other suitable arrangements can be employed, e.g., a beamsplitter or a fiber coupler. The dual-frequency optical source 100 is arranged and operated so that the output difference frequency $v_2-v_1$ is greater than about 300 GHz. In some examples the output difference frequency $v_2-v_1$ is greater than about 1 THz; in some examples the output difference frequency $v_2-v_1$ is greater than about 5 THz; in some examples the output difference frequency $v_2-v_1$ is greater than about 10 THz; in some of those examples the output difference frequency $v_2-v_1$ is greater than about 100 THz. Because the frequencies $v_1$ and $v_2$ are generated within the same cavity, there is high degree of correlation in their respective fluctuations so that the difference frequency $v_2-v_1$ is quite stable. Also, other resonator geometries (e.g., a linear resonator) can be employed for generating the dual SBL reference lines.

A method for generating first and second optical output signals 120a/120b comprises simultaneously pumping the optical resonator 110/110' with optical pump power from first and second pump laser sources 130a/130b.

In some examples of an inventive dual-frequency optical source, the free spectral range (FSR) of the optical resonator 110/110' is substantially equal to the Brillouin shift frequency of the optical resonator. In some examples, the optical resonator comprises silica and the Brillouin shift frequency of the optical resonator is about 10.9 GHz; other needed, desired, or suitable materials can be employed that exhibit different Brillouin shift frequencies.

The reference optical signals 120a/120b can be provided at any needed, desired, or suitable optical frequencies. In some examples the, first and second optical reference frequencies $v_1$ and $v_2$ are each between about 75 THz and about 750 THz (i.e., wavelengths between about 400 nm and about 4 μm), between about 120 THz and about 430 THz (i.e., wavelengths between about 700 nm and about 2.5 μm), or between about 150 THz and about 300 THz (i.e., between about μm and about 2 μm). The latter two ranges can be convenient due to ready availability of fiber-optic and/or solid state sources in those wavelength regions. Other wavelengths can be employed.

In some examples, the dual optical-frequency reference source 100 is stabilized so as to maintain fluctuations of a reference difference frequency $v_2-v_1$ (i.e., relative frequency stability of the lasers) within an operationally acceptable optical reference bandwidth. In some examples, the operationally acceptable reference bandwidth (given as a bandwidth characterized over a given time interval) is less than about 100 Hz over about a 1 second timescale, or less than about 1Hz over about a 1 second timescale. In some examples, the operationally acceptable reference bandwidth (given as optical phase noise at a given offset frequency relative to the optical carrier frequency) is about −40 dBc/Hz at 100 Hz offset frequency and about −80 dBc/Hz at 10 kHz offset frequency, or about −80 dBc/Hz at 100 Hz offset frequency and about −125 dBc/Hz at 10 kHz offset frequency. Generally, improved levels of relative stability of the laser sources will translate directly into improvements in the overall frequency stability of the microwave-frequency output signal. Still better stabilized references can be employed as needed, desired, or suitable, or as suitable optical sources are developed or become available.

In some examples, each one of the first and second pump laser sources is frequency-locked to the corresponding resonant optical mode of the resonator 110/110' by a Pound-Drever-Hall mechanism; any suitable mechanism can be employed, e.g., a Hänsch-Couillaud mechanism. In the example of FIG. 7, each pump laser 130a/130b (emitting at corresponding wavelengths $\lambda_1$ and $\lambda_2$) is frequency-locked to a corresponding distinct resonant optical mode of the disk resonator 110 using the Pound-Drever-Hall (PDH) technique, is coupled into the disk resonator 110 by a circulator 114, and excites its own corresponding Brillouin laser in the backward-propagating direction at respective optical reference frequencies $v_1$ and $v_2$. The PDH technique is implemented for each pump laser 130a/130b by employing respective optical bandpass filters 132a/132b, photodetectors 134a/134b, and feedback/servo mechanisms 136a/136b; control of each pump wavelength can be via direct laser control (as with pump laser 130a) or via frequency shifting of the laser output (as with acousto-optic shifting of the output of pump laser 130b). The frequency separation (i.e., the difference frequency $v_2-v_1$) between the two SBS lasers can be readily tuned by tuning the pump lasers 130a/130b to pump at resonator modes with different azimuthal mode orders. FIG. 8 shows a similar example wherein the disk resonator 110 has been replaced by a fiber-loop optical resonator 110' (i.e., a fiber-loop cavity or FLC), and wherein both pump lasers 130a/130b are subject to direct control of their respective wavelengths.

The use of a fiber-loop optical resonator 110' enables use of readily available fiber optic components that have been developed for telecommunications-related applications, and also enables a performance benefit in terms of a significantly lower phase noise (up to 40 dB lower) in the frequency reference itself compared with the disk resonator 110. This improvement is believed to arise for two reasons. First, the fiber-loop cavity has a much larger round trip length (on the order of 100 m to 500 m) compared with a disk resonator (round trip length on the order of 10 mm to 100 mm). Consequently, frequency fluctuation arising from random temperature fluctuations of the fiber loop cavity are greatly reduced relative to the disk resonator. Second, the longer cavity length of a fiber-loop cavity results in a correspondingly longer intracavity photon storage time compared to the disk resonator. A longer photon storage time in turn leads to correspondingly lower fundamental Schawlow-Townes frequency noise of the laser.

While dual-pumped Brillouin lasers using optical fiber have been previously demonstrated (as noted above), they have been operated as microwave sources with frequency separation typically less than about 100 GHz and not as difference frequency references with frequency separation greater than about 300 GHz, about 1 THz, about 5 THz, about 10 THz, about 100 THz, or even higher. To the inventors' knowledge, there has been no work demonstrating dual-pumped, dual-Brillouin laser line operation at difference frequencies greater than about 300 GHz; in fact, such large frequency separation would make previous dual-Brillouin lasers unsuitable for their intended purpose. Before development of the optical frequency division techniques disclosed above, there would have been no need to generate dual reference frequencies so widely spaced apart. There also has been no attempt to characterize or to understand operation of the dual-Brillouin laser with this application in mind.

The detailed layout for using the dual-mode SBLs as optical difference frequency references with optical frequency division for stable microwave generation is shown in FIGS. 7 (using a disk resonator 110) and FIG. 8 (using a fiber-loop resonator). Referring to FIG. 8, two pump lasers 130a/130b (independently tunable CW lasers) are frequency-locked to the Brillouin-active fiber loop cavity 110' (FLC) using the standard Pound-Drever-Hall locking technique employing optical bandpass filters 132a/132b, photodetectors 134a/134b, and feedback/servo mechanisms 136a/136b. Each pump laser 130a/130b excites its own stimulated Brillouin laser once the circulating pump power in the fiber-loop cavity 110' reaches threshold. The frequency separation between the two SBLs can be tuned from 10s of MHz to 100 THz or more by tuning the frequency separation between the two pump lasers 130a/130b. For optical frequency division, frequency separation between the two SBLs can be on the order of several THz. For example, using one pump laser at 1550 nm, the frequency separation of the two SBLs can be set to 1 THz (tuning the second pump laser to 1542 nm), to 10 THz (tuning the second pump laser to 1473 nm), or to 100 THz (tuning the second pump laser to 1022 nm). The difference frequency between the co-oscillating, dual-mode SBL outputs is then used as the stable optical-frequency reference in the frequency division process (as in FIG. 3). Any suitable optical divider can be employed, including in some examples the electro-optic frequency divider described above. In some other examples, the OFD is based on the conventional mode-locked optical frequency comb (OFC), where two comb lines of the OFC are frequency-locked to the two SBLs such that the repetition rate of the OFC gives a stable, divided microwave output. However, the inventive electro-optic frequency divider is simpler to implement and has been observed to relax the linearity constraints of high-bandwidth photodetection that have posed significant challenges for optical frequency division based on mode-locked OFC.

Figures 9A, 9B:
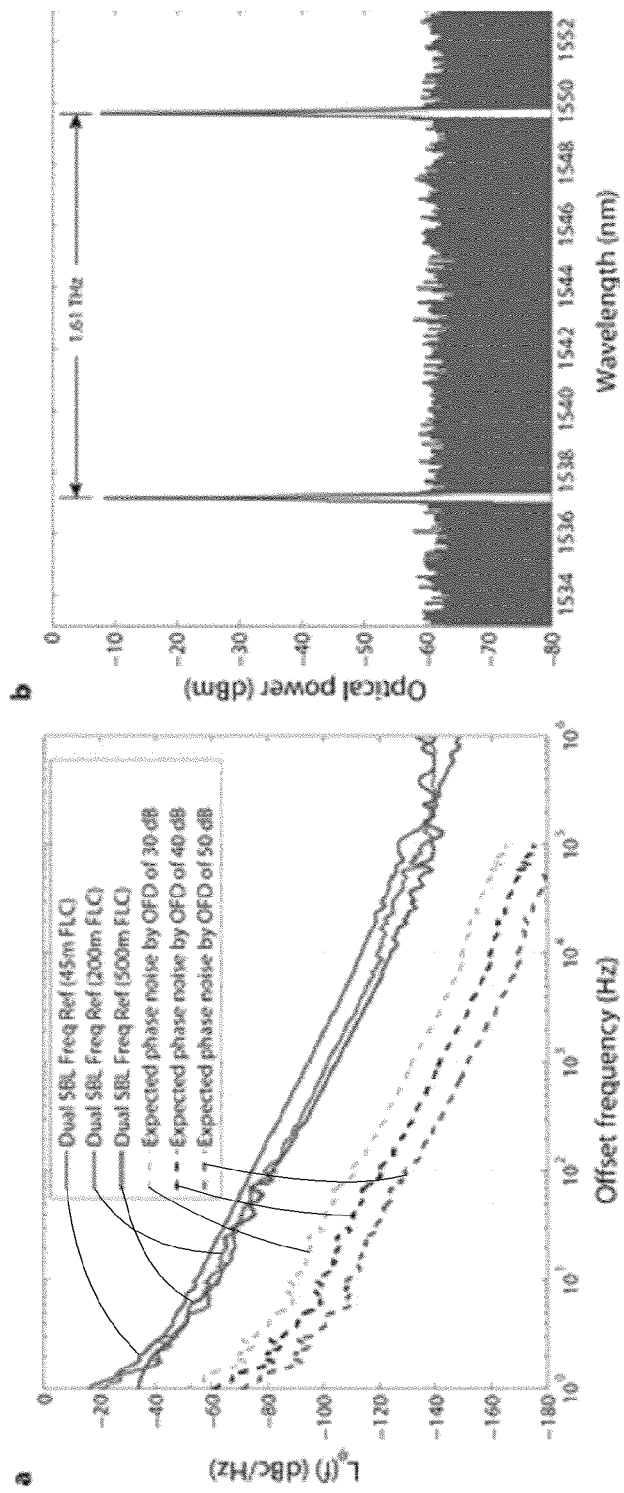
FIGS. 9A and 9B are plots of measured spectra of an inventive dual-frequency optical source.

A series of FLCs have been constructed, consisting of a 90/10 fused coupler, and different cavity round trip path lengths of 45 meter (FSR 4.4 MHz), 200 meter (FSR 1 MHz) and 500 meter (FSR 400 kHz); any other needed, desired, or suitable fiber-loop cavity length can be employed, .e.g., greater than or equal to about 40 meters long, greater than or equal to about 100 meters long, greater than or equal to about 200 meters long, or greater than or equal to about 500 meters long. A longer fiber-loop optical resonator typically exhibits less frequency and phase noise relative to a shorter fiber-loop optical resonator, all other things being equal. The measured optical finesse of these FLCs are around 40 (mainly limited by the coupler loss), and the pump threshold for SBS oscillation is on the order of a few hundred microwatts. Above SBL threshold, the pump power of each pump laser (at 1550 nm wavelength region) is increased until a point is reached (~1 mW) such that lasing at the first-order Stokes frequency starts to excite second-order Stokes waves in the resonator. FIG. 9B shows the measured optical spectrum of the dual-mode SBL difference frequency reference with a frequency separation of 1.61 THz (12.5 nm), obtained by dual pumping the FLC at 1537.2 nm and 1549.6 nm. It has been observed that onset of oscillation of the second-order Stokes line appears to clamp the intracavity power of the first-order Stokes line. The fundamental limit of the relative frequency stability of the dual-mode SBLs is determined by the Schawlow-Townes frequency noise ($S_v$) of the Brillouin laser, which upon power clamping has been observed to vary inversely with the volume of a resonant optical mode. A longer fiber-loop cavity has a larger effective mode volume and hence a reduced Schawlow-Townes noise upon power clamping caused by the onset of second-order Stokes oscillation.

In order to characterize the phase noise of the relative frequency stability of dual-mode SBLs (i.e., stability of the difference frequency $v_2-v_1$), the frequency separation of the dual SBLs is tuned to a frequency sufficiently low to be detected directly using a fast photodiode and processed electronically (this is essentially the case of unity division). The detected beat note is set at 20 GHz and its phase noise is measured using a phase noise analyzer (Rohde Schwartz, model number FSUP26). The measured single-sideband (SSB) phase noise spectra of the SBL beat note from the different FLCs are shown in FIG. 9A (45 m FLC: top solid curve; 200 m FLC: middle solid curve; 500 m FLC: bottom solid curve). All the measured phase noise spectra show a Schawlow-Townes-noise-limited phase noise ($1/f^2$ dependence) over a broad range of offset frequencies starting from a few Hz to over 100 kHz. The common-mode technical noise of the SBLs substantially cancels out of the beat note signal upon optical detection. Thus the phase noise of the relative frequency stability in the dual mode SBLs is limited by the fundamental Schawlow-Townes noise and is invariant with the frequency separation between the two co-oscillating SBLs. Therefore, with the dual-mode SBLs tuned to larger difference frequency, a significant reduction in phase noise results from the optical frequency division process. The optically-divided microwave-frequency signal ($f_M$) benefits from the reduction of the optical phase noise by the square of the division ratio, $N \equiv (v_2 v_1)/f_M$. For example, a division factor of N=100 will lead to a phase noise reduction factor of 10,000 (or 20log10N=40 dB).

Furthermore, the measured single-side-band (SSB) phase noise of the difference frequency of the dual-mode SBLs (without any optical frequency division) is already improved compared with previous results. The measured phase noise of the dual-mode SBL beat note (carrier: 20 GHz, offset frequency: 1 kHz) is −95 dBc/Hz (45 m FLC), −101 dBc/Hz (200 m FLC), and −105 dBc/Hz (500 m FLC), as shown in FIG. 9A. The 500 m FLC exhibited about −125 dBc/Hz at 10 kHz offset frequency, compared to about −83 dBc/Hz for a disk resonator with a round-trip length of about 18 mm. A roughly linear decrease of the phase noise with the increase of the FLC length is observed, in good agreement with the known inverse dependence of the Schawlow-Townes noise of the SBL on the cavity model volume. We also measured the Allan Deviation (ADEV) of the 20 GHz beat note. For 0.2 s to 1 s gate time, the measured fractional ADEV is on the order of $1 \times 10^{-11}$. In comparison, some previous work showed a measured phase noise of −90 dBc/Hz for the 5-20 GHz beat note at 1kHz offset frequency, based on direct optical detection of dual-mode SBLs generated from a 20 meter FLC. Other work showed the Allan deviation for a 148 MHz beat note; for 0.2 s to 1 s gate time, a fractional ADEV on the order of $1 \times 10^{-7}$ was observed. To the inventors' knowledge the results reported here are the first demonstration of increased length in FLCs resulting in reduced Schawlow-Townes noise of SBLs for low-phase-noise microwave generation in microwave photonics, including both direct-beat-note-generation-based microwave sources and optical-frequency-division-based microwave sources.

Finally, the predicted phase noise of the optically-divided microwave signals based on OFD from the dual-mode SBL difference frequency reference (based on a 200 m FLC) is also plotted in FIG. 9A. The dashed top, middle, and bottom curves correspond to division ratios of N=33, 100, and 330, respectively. The carrier frequency of the optically divided microwave signal is fixed at 10 GHz. Therefore, these division ratios correspond to the dual-mode SBL frequency separation set to 330 GHz, 1 THz, and 3.3 THz respectively.

The predicted phase noise levels in FIG. 9A represent record low levels. Moreover, the oscillator based on the SBL difference frequency reference does not require costly hardware, nor does it need to operate at vacuum or cryogenic conditions. As a result, the technology can be easily deployed in various applications, such as radar, communications, and navigation systems.

In addition to the preceding, the following examples fall within the scope of the present disclosure or appended claims:

EXAMPLE 1

A microwave-frequency source for generating an output electrical signal at an output frequency $f_M$, the microwave-frequency source comprising: (a) a dual optical-frequency reference source arranged so as to generate (i) a first optical reference signal at a first optical reference frequency $v_1$ and (ii) a second optical reference signal at a second optical reference frequency $v_2 > v_1$; (b) an electro-optic sideband generator arranged so as to (i) receive the first and second optical reference signals and a sideband generator input electrical signal at the frequency $f_M$ and (ii) generate therefrom multiple sideband optical signals at respective sideband optical frequencies of the form $v_1 \pm n_1 f_M$ and $v_2 \pm n_2 f_M$, wherein $n_1$ and $n_2$ are integers; (c) an optical bandpass filter arranged so as to transmit a subset of the multiple sideband optical signals including the sideband optical signal at a frequency $v_1 + N_1 f_M$ and the sideband optical signal at a frequency $v_2 - N_2 f_M$, wherein $N_1$ and $N_2$ are integers; (d) an optical detector arranged so as to (i) receive the transmitted sideband optical signals and (ii) generate an optical detector electrical signal at a beat frequency $f_{BEAT} = (v_2 - N_2 f_M) - (v_1 + N_1 f_M)$; (e) a reference oscillator arranged so as to generate a reference oscillator electrical signal at a reference oscillator frequency $f_R$; (f) an electrical circuit arranged so as to (i) receive the optical detector electrical signal and the reference oscillator electrical signal, (ii) generate therefrom, using a comparator portion of the electrical circuit, an electrical error signal dependent on relative phase of the optical detector and reference oscillator electrical signals, and (iii) process the electrical error signal using a loop-filter portion of the electrical circuit; and (g) a voltage-controlled electrical oscillator arranged so as to (i) receive the loop-filtered electrical error signal as a VCO input electrical signal and (ii) generate a VCO output electrical signal at the frequency $f_M$, wherein a first portion of the VCO output electrical signal is received by the electro-optic sideband generator as the sideband generator input electrical signal and a second portion of the VCO output electrical signal forms the output electrical signal of the microwave-frequency source, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

EXAMPLE 2

The microwave-frequency source of Example 1 wherein phase noise of the output electrical signal of the microwave-frequency source is reduced by a factor of about $(N_1 + v_2)^2$ relative to phase noise of a reference difference frequency signal at a reference difference frequency $v_2-v_1$ of the dual optical-frequency reference source.

EXAMPLE 3

The microwave-frequency source of any one of Examples 1 or 2 wherein the output frequency $f_M$ is between about 0.3 GHz and about 300 GHz.

EXAMPLE 4

The microwave-frequency source of any one of Examples 1 or 2 wherein the output frequency $f_M$ is between about 1 GHz and about 100 GHz.

EXAMPLE 5

The microwave-frequency source of any one of Examples 1-4 wherein the reference oscillator frequency and the beat frequency are between about 1 MHz and about 500 MHz.

EXAMPLE 6

The microwave-frequency source of any one of Examples 1-4 wherein the reference oscillator frequency and the beat frequency are between about 5 MHz and about 100 MHz.

EXAMPLE 7

The microwave-frequency source of any one of Examples 1-4 wherein the reference oscillator frequency and the beat frequency are between about 10 MHz and about 50 MHz.

EXAMPLE 8

The microwave-frequency source of any one of Examples 1-7 wherein the reference oscillator comprises a crystal oscillator, e.g., a quartz oscillator.

EXAMPLE 9

The microwave-frequency source of any one of Examples 1-7 wherein the reference oscillator comprises an electrical oscillator, e.g., a frequency-synthesized oscillator.

EXAMPLE 10

The microwave-frequency source of any one of Examples 1-9 wherein a reference difference frequency $v_2-v_1$ is greater than about 100 GHz.

EXAMPLE 11

The microwave-frequency source of any one of Examples 1-9 wherein a reference difference frequency $v_2-v_1$ is greater than about 1 THz.

EXAMPLE 12

The microwave-frequency source of any one of Examples 1-9 wherein a reference difference frequency $v_2-v_1$ is greater than about 10 THz.

EXAMPLE 13

The microwave-frequency source of any one of Examples 1-9 wherein a reference difference frequency $v_2-v_1$ is greater than about 100 THz.

EXAMPLE 14

The microwave-frequency source of any one of Examples 1-13 wherein $N_1+N_2$ is greater than or equal to 10.

EXAMPLE 15

The microwave-frequency source of any one of Examples 1-13 wherein $N_1+A/_2$ is greater than or equal to 50.

EXAMPLE 16

The microwave-frequency source of any one of Examples 1-13 wherein $N_1+N_2$ is greater than or equal to 100.

EXAMPLE 17

The microwave-frequency source of any one of Examples 1-13 wherein $N_1+N_2$ is greater than or equal to 1000.

EXAMPLE 18

The microwave-frequency source of any one of Examples 1-17 wherein the first and second optical reference frequencies $v_1$ and $v_2$ are each between about 75 THz and about 750 THz.

EXAMPLE 19

The microwave-frequency source of any one of Examples 1-17 wherein the first and second optical reference frequencies $v_1$ and $v_2$ are each between about 120 THz and about 430 THz.

EXAMPLE 20

The microwave-frequency source of any one of Examples 1-17 wherein the first and second optical reference frequencies $v_1$ and $v_2$ are each between about 150 THz and about 300 THz.

EXAMPLE 21

The microwave-frequency source of any one of Examples 1-20 wherein the dual optical-frequency reference source is stabilized so as to (i) maintain fluctuations of a reference difference frequency $v_2-v_1$ within an operationally acceptable optical reference bandwidth or (ii) maintain phase noise of a reference difference frequency signal within an operationally acceptable reference phase noise level.

EXAMPLE 22

The microwave-frequency source of Example 21 wherein the operationally acceptable reference bandwidth is less than about 100 Hz over about a 1 second timescale.

EXAMPLE 23

The microwave-frequency source of Example 21 wherein the operationally acceptable reference bandwidth is less than about 1 Hz over about a 1 second timescale.

EXAMPLE 24

The microwave-frequency source of Example 21 wherein the operationally acceptable reference phase noise level is about −40 dBc/Hz at 100 Hz offset frequency and about −80 dBc/Hz at 10 kHz offset frequency.

EXAMPLE 25

The microwave-frequency source of Example 21 wherein the operationally acceptable reference phase noise level is about −80 dBc/Hz at 100 Hz offset frequency and about −125 dBc/Hz at 10 kHz offset frequency.

EXAMPLE 26

The microwave-frequency source of any one of Examples 1-25 wherein (i) the dual optical-frequency reference source comprises first and second pump laser sources and an optical resonator, (ii) a free spectral range of the optical resonator is substantially equal to an integer submultiple of a Brillouin shift frequency of the optical resonator, (iii) each one of the first and second pump laser sources is frequency-locked to a corresponding resonant optical mode of the optical resonator, and (iv) the first and second optical reference signals comprise stimulated Brillouin laser output generated by optical pumping of the optical resonator simultaneously by the first and second pump laser sources, respectively.

EXAMPLE 27

The microwave-frequency source of Example 26 wherein the free spectral range of the optical resonator is substantially equal to the Brillouin shift frequency of the optical resonator.

EXAMPLE 28

The microwave-frequency source of any one of Examples 26 or 27 wherein the optical resonator comprises silica and the Brillouin shift frequency of the optical resonator is about 10.9 GHz.

EXAMPLE 29

The microwave-frequency source of any one of Examples 26-28 wherein the optical resonator comprises a ring optical resonator.

EXAMPLE 30

The microwave-frequency source of Example 29 wherein the ring optical resonator comprises a disk optical resonator.

EXAMPLE 31

The microwave-frequency source of any one of Examples 26-28 wherein the optical resonator comprises a fiber optical resonator.

EXAMPLE 32

The microwave-frequency source of Example 31 wherein the fiber optical resonator comprises a fiber Fabry-Perot optical resonator.

EXAMPLE 33

The microwave-frequency source of Example 31 wherein the fiber optical resonator comprises a fiber-loop optical resonator.

EXAMPLE 34

The microwave-frequency source of any one of Examples 26-33 wherein each one of the first and second pump laser sources is frequency-locked to the corresponding resonant optical mode of the optical resonator by a Pound-Drever-Hall mechanism.

EXAMPLE 35

The microwave-frequency source of any one of Examples 1-25 wherein the dual optical-frequency reference source comprises a dual-mode laser source.

EXAMPLE 36

The microwave-frequency source of any one of Examples 1-25 wherein the dual optical-frequency reference source comprises first and second reference laser sources, wherein the first and second laser sources are each frequency-locked to a corresponding distinct resonant optical mode of a common optical reference cavity.

EXAMPLE 37

The microwave-frequency source of any one of Examples 1-25 wherein the dual optical-frequency reference source comprises first and second reference laser sources, wherein the first and second laser sources are each frequency-locked to a corresponding distinct atomic transition.

EXAMPLE 38

The microwave-frequency source of any one of Examples 1-37 wherein (i) the electro-optic sideband generator comprises one or more electro-optic phase modulators each driven by a corresponding portion of the sideband generator input electrical signal at the frequency $f_M$, and (ii) the one or more phase modulators are arranged so as to transmit the first and second optical reference signals so as to generate the multiple optical sideband signals.

EXAMPLE 39

The microwave-frequency source of any one of Examples 1-37 wherein (i) the electro-optic sideband generator comprises two or more electro-optic phase modulators each driven by a corresponding portion of the sideband generator input electrical signal at the frequency $f_M$, and (ii) the two or more phase modulators are arranged in series so as to sequentially transmit the first and second optical reference signals so as to generate the multiple optical sideband signals.

EXAMPLE 40

The microwave-frequency source of any one of Examples 38 or 39 wherein pairs of sideband optical signals are generated with $n_1+n_2$ ranging from 2 up to at least 30.

EXAMPLE 41

The microwave-frequency source of any one of Examples 38 or 39 wherein pairs of sideband optical signals are generated with $n_1+n_2$ ranging from 2 up to at least 100.

EXAMPLE 42

The microwave-frequency source of any one of Examples 1-41 wherein (i) the electro-optic sideband generator comprises one or more electro-optic phase modulators each driven by a corresponding portion of the sideband generator input electrical signal at the frequency $f_M$, an intensity modulator driven by a corresponding portion of the sideband generator input electrical signal at the frequency $f_M$, a dispersion compensator, an optical amplifier, and a nonlinear optical medium, and (ii) the one or more phase modulators, the intensity modulator, the dispersion compensator, the optical amplifier, and the nonlinear optical medium are arranged in series so as to sequentially, in order, transmit the first and second optical reference signals so as to generate the multiple optical sideband signals.

EXAMPLE 43

The microwave-frequency source of any one of Examples 38-42 wherein pairs of sideband optical signals are generated with $n_1+n_2$ ranging from 2 up to at least 100.

EXAMPLE 44

The microwave-frequency source of any one of Examples 38-42 wherein pairs of sideband optical signals are generated with $n_1+n_2$ ranging from 2 up to at least 10000.

EXAMPLE 45

The microwave-frequency source of any one of Examples 42-44 wherein (i) the intensity modulator comprises an electro-optic Mach-Zehnder modulator, (ii) the dispersion compensator comprises a suitably dispersive optical fiber, (iii) the optical amplifier comprises a doped optical fiber amplifier and (iv) the nonlinear optical medium comprises a nonlinear optical fiber.

EXAMPLE 46

A method, using the microwave-frequency source of any one of Examples 1-45, for generating a microwave-frequency output electrical signal at an output frequency $f_M$, the method comprising: (a) using the dual optical-frequency reference source, generating (i) the first optical reference signal at the first optical reference frequency $v_1$ and (ii) the second optical reference signal at the second optical reference frequency $v_2>v_1$; (b) using the electro-optic sideband generator, (i) receiving the first and second optical reference signals and the sideband generator input electrical signal at the frequency $f_M$ and (ii) generating therefrom the multiple sideband optical signals at respective sideband optical frequencies of the form $v_1 \pm n_1 f_M$ and $v_2 \pm n_2 f_M$, wherein $n_1$ and $n_2$ are integers; (c) using the optical bandpass filter, transmitting the subset of the multiple sideband optical signals including the sideband optical signal at a frequency $v_1+N_1 f_M$ and the sideband optical signal at a frequency $v_2-N_2 f_M$, wherein $N_1$ and $N_2$ are integers; (d) using the optical detector, (i) receiving the transmitted sideband optical signals and (ii) generating the optical detector electrical signal at the beat frequency $f_{BEAT}=(v_2-N_2 f_M)-(v_1+N_1 f_M)$; (e) using the reference oscillator, generating the reference oscillator electrical signal at the reference oscillator frequency $f_R$; (f) using the electrical circuit, (i) receiving the optical detector electrical signal and the reference oscillator electrical signal, (ii) using the comparator portion of the electrical circuit, generating, from the optical detector electrical signal and the reference oscillator electrical signal, the electrical error signal dependent on relative phase of the optical detector and reference oscillator electrical signals, and (iii) using the loop-filter portion of the electrical circuit, processing the electrical error signal; and (g) using the voltage-controlled electrical oscillator, (i) receiving the loop-filtered electrical error signal as a VCO input electrical signal and (ii) generating the VCO output electrical signal at the frequency $f_M$, wherein the first portion of the VCO output electrical signal is received by the electro-optic sideband generator as the sideband generator input electrical signal and the second portion of the VCO output electrical signal forms the microwave-frequency output electrical signal, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

EXAMPLE 47

A dual-frequency optical source comprising: (a) first and second pump laser sources arranged to generate optical pump power at respective first and second pump laser frequencies $v_{pump1}$ and $v_{pump2}$; and (b) an optical resonator characterized by a Brillouin shift frequency $v_B$ and a free spectral range that is substantially equal to an integer submultiple of the Brillouin shift frequency, wherein: (c) each one of the first and second pump laser sources is frequency-locked to a corresponding resonant optical mode of the optical resonator; (d) first and second optical output signals of the dual-frequency optical reference source at respective first and second output frequencies $v_1=v_{pump1}-v_B$ and $v_2=v_{pump2}-v_B$ comprise stimulated Brillouin laser output generated by simultaneous optical pumping of the optical resonator by the first and second pump laser sources, respectively; and (e) an output difference frequency $v_2-v_1$ is greater than about 300 GHz.

EXAMPLE 48

The dual-frequency optical source of Example 47 wherein the free spectral range of the optical resonator is substantially equal to the Brillouin shift frequency of the optical resonator.

EXAMPLE 49

The dual-frequency optical source of any one of Examples 47 or 48 wherein the optical resonator comprises a ring optical resonator.

EXAMPLE 50

The dual-frequency optical source of Example 49 wherein the ring optical resonator comprises a disk optical resonator.

EXAMPLE 51

The dual-frequency optical source of any one of Examples 47 or 48 wherein the optical resonator comprises a fiber optical resonator.

EXAMPLE 52

The dual-frequency optical source of Example 51 wherein the fiber optical resonator comprises a fiber Fabry-Perot optical resonator.

EXAMPLE 53

The dual-frequency optical source of Example 51 wherein the fiber optical resonator comprises a fiber-loop optical resonator.

EXAMPLE 54

The dual-frequency optical source of any one of Examples 51-53 wherein the fiber optical resonator includes an optical fiber greater than or equal to about 40 meters long.

EXAMPLE 55

The dual-frequency optical source of any one of Examples 51-53 wherein the fiber optical resonator includes an optical fiber greater than or equal to about 100 meters long.

EXAMPLE 56

The dual-frequency optical source of any one of Examples 51-53 wherein the fiber optical resonator includes an optical fiber greater than or equal to about 200 meters long.

EXAMPLE 57

The dual-frequency optical source of any one of Examples 51-53 wherein the fiber optical resonator includes an optical fiber greater than or equal to about 500 meters long.

EXAMPLE 58

The dual-frequency optical source of any one of Examples 47-57 wherein the optical resonator comprises silica and the Brillouin shift frequency of the optical resonator is about 10.9 GHz.

EXAMPLE 59

The dual-frequency optical source of any one of Examples 47-58 wherein the output difference frequency $v_2-v_1$ is greater than about 1 THz.

EXAMPLE 60

The dual-frequency optical source of any one of Examples 47-58 wherein the output difference frequency $v_2-v_1$ is greater than about 10 THz.

EXAMPLE 61

The dual-frequency optical source of any one of Examples 47-58 wherein the output difference frequency $v_2-v_1$ is greater than about 100 THz.

EXAMPLE 62

The dual-frequency optical source of any one of Examples 47-61 wherein the first and second optical reference frequencies $v_1$ and $v_2$ are each between about 75 THz and about 750 THz.

EXAMPLE 63

The dual-frequency optical source of any one of Examples 47-61 wherein the first and second optical reference frequencies $v_1$ and $v_2$ are each between about 120 THz and about 430 THz.

EXAMPLE 64

The dual-frequency optical source of any one of Examples 47-61 wherein the first and second optical reference frequencies $v_1$ and $v_2$ are each between about 150 THz and about 300 THz.

EXAMPLE 65

The dual-frequency optical source of any one of Examples 47-64 wherein the dual-frequency optical source is stabilized so as to (i) maintain fluctuations of the output difference frequency $v_2-v_1$ within an operationally acceptable optical bandwidth or (ii) maintain phase noise of an optical signal at the output difference frequency within an operationally acceptable reference phase noise level.

EXAMPLE 66

The dual-frequency optical source of Example 65 wherein the operationally acceptable bandwidth is less than about 100 Hz over about a 1 second timescale.

EXAMPLE 67

The dual-frequency optical source of Example 65 wherein the operationally acceptable bandwidth is less than about 1 Hz over about a 1 second timescale.

EXAMPLE 68

The dual-frequency optical source of Example 65 wherein the operationally acceptable reference phase noise level is about −40 dBc/Hz at 100 Hz offset frequency and about −80 dBc/Hz at 10 kHz offset frequency.

EXAMPLE 69

The dual-frequency optical source of Example 65 wherein the operationally acceptable reference phase noise level is about −80 dBc/Hz at 100 Hz offset frequency and about −125 dBc/Hz at 10 kHz offset frequency.

EXAMPLE 70

The dual-frequency optical source of any one of Examples 65-69 wherein each one of the first and second pump laser sources is frequency-locked to the corresponding resonant optical mode of the resonator by a Pound-Drever-Hall mechanism.

EXAMPLE 71

A method for generating first and second optical output signals using any one of Examples 47-70, the method comprising simultaneously pumping the optical resonator with optical pump power from the first and second pump laser sources, wherein: (a) the first and second pump laser sources are arranged to generate optical pump power at respective first and second pump laser frequencies $v_{pump1}$ and $v_{pump2}$; (b) the optical resonator is characterized by a Brillouin shift frequency $v_B$ and a free spectral range that is substantially equal to an integer submultiple of the Brillouin shift frequency; (c) each one of the first and second pump laser sources is frequency-locked to a corresponding resonant optical mode of the optical resonator; (d) the first and second optical output signals are at respective first and second output frequencies $v_1=v_{pump1}-v_B$ and $v_2=v_{pump2}-v_B$ and comprise stimulated Brillouin laser output generated by the simultaneous optical pumping of the optical resonator by the first and second pump laser sources, respectively; and (e) an output difference frequency $v_2-v_1$ is greater than about 300 GHz.

EXAMPLE 72

The method of Example 71 further comprising, using an optical frequency divider, dividing the output difference frequency by a division factor N.

EXAMPLE 73

The method of Example 72 wherein the division factor is greater than or equal to about 10.

EXAMPLE 74

The method of Example 72 wherein the division factor is greater than or equal to about 100.

EXAMPLE 75

The method of Example 72 wherein the division factor is greater than or equal to about 1000.

EXAMPLE 76

The microwave-frequency source of any one of Examples 1-45 wherein the dual optical-frequency reference source comprises the dual-frequency optical source of any one of Examples 47-70.

EXAMPLE 77

The method of Example 46 wherein the dual optical-frequency reference source comprises the dual-frequency optical source of any one of Examples 47-70.

EXAMPLE 78

The method of Example 77 further comprising performing the method of any one of Examples 71-75.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise.

In the appended claims, if the provisions of 35 USC §112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A dual-frequency optical source, comprising:
   first and second pump laser sources arranged to generate optical pump power at respective first and second pump laser frequencies $v_{pump1}$ and $v_{pump2}$; and
   a fiber optical resonator characterized by a Brillouin shift frequency $v_B$ and a free spectral range that is substantially equal to an integer submultiple of the Brillouin shift frequency,
   wherein each one of the first and second pump laser sources is frequency-locked to a corresponding resonant optical mode of the fiber optical resonator, wherein first and second optical output signals of the dual-frequency optical reference source at respective first and second output frequencies $v_1 = v_{pump1} - v_B$ and $v_2 = v_{pump2} - v_B$ comprise stimulated Brillouin laser output generated by simultaneous optical pumping of the fiber optical resonator by the first and second pump laser sources, respectively, wherein an output difference frequency $v_2 - v_1$ is greater than about 300 GHz, and wherein the fiber optical resonator includes an optical fiber greater than or equal to about 100 meters long.

2. The dual-frequency optical source of claim 1 wherein the free spectral range of the fiber optical resonator is substantially equal to the Brillouin shift frequency of the fiber optical resonator.

3. The dual-frequency optical source of claim 1 wherein the fiber optical resonator comprises a fiber Fabry-Perot optical resonator.

4. The dual-frequency optical source of claim 1 wherein the fiber optical resonator comprises a fiber-loop optical resonator.

5. The dual-frequency optical source of claim 1 wherein the fiber optical resonator includes an optical fiber greater than or equal to about 200 meters long.

6. The dual-frequency optical source of claim 1 wherein the fiber optical resonator includes an optical fiber greater than or equal to about 500 meters long.

7. The dual-frequency optical source of claim 1 wherein the optical resonator comprises silica and the Brillouin shift frequency of the optical resonator is about 10.9 GHz.

8. The dual-frequency optical source of claim 1 wherein the first and second optical reference frequencies $v_1$ and $v_2$ are each between about 75 THz and about 750 THz.

9. The dual-frequency optical source of claim 1 wherein the first and second optical reference frequencies $v_1$ and $v_2$ are each between about 120 THz and about 430 THz.

10. The dual-frequency optical source of claim 1 wherein the first and second optical reference frequencies $v_1$ and $v_2$ are each between about 150 THz and about 300 THz.

11. A method for generating first and second optical output signals using the dual-frequency optical source of claim 1, the method comprising simultaneously pumping the fiber optical resonator with optical pump power from first and second pump laser sources, wherein:

(a) the first and second pump laser sources are arranged to generate optical pump power at respective first and second pump laser frequencies $v_{pump1}$ and $v_{pump2}$;

(b) the fiber optical resonator is characterized by a Brillouin shift frequency $v_B$ and a free spectral range that is substantially equal to an integer submultiple of the Brillouin shift frequency;

(c) each one of the first and second pump laser sources is frequency-locked to a corresponding resonant optical mode of the fiber optical resonator;

(d) the first and second optical output signals are at respective first and second output frequencies $v_1 = v_{pump1} - v_B$ and $v_2 = v_{pump2} - v_B$ and comprise stimulated Brillouin laser output generated by the simultaneous optical pumping of the fiber optical resonator by the first and second pump laser sources, respectively; and (e) an output difference frequency $v_2 - v_1$ is greater than about 300 GHz.

12. A dual-frequency optical source, comprising:

first and second pump laser sources arranged to generate optical pump power at respective first and second pump laser frequencies $v_{pump1}$ and $v_{pump2}$; and a fiber optical resonator characterized by a Brillouin shift frequency $v_B$ and a free spectral range that is substantially equal to an integer submultiple of the Brillouin shift frequency, wherein each one of the first and second pump laser sources is frequency-locked to a corresponding resonant optical mode of the fiber optical resonator, wherein first and second optical output signals of the dual-frequency optical reference source at respective first and second output frequencies $v_1 = v_{pump1} - v_B$ and $v_2 = v_{pump2} - v_B$ comprise stimulated Brillouin laser output generated by simultaneous optical pumping of the fiber optical resonator by the first and second pump laser sources, respectively, wherein the output difference frequency $v_2 - v_1$ is greater than about 1 THz.

13. The dual-frequency optical source of claim 12 wherein the output difference frequency $v_2 - v_1$ is greater than about 10 THz.

14. The dual-frequency optical source of claim 12 wherein the output difference frequency $v_2 - v_1$ is greater than about 100 THz.

15. A dual-frequency optical source, comprising:

first and second pump laser sources arranged to generate optical pump power at respective first and second pump laser frequencies $v_{pump1}$ and $v_{pump2}$; and a fiber optical resonator characterized by a Brillouin shift frequency $v_B$ and a free spectral range that is substantially equal to an integer submultiple of the Brillouin shift frequency, wherein each one of the first and second pump laser sources is frequency-locked to a corresponding resonant optical mode of the fiber optical resonator, wherein first and second optical output signals of the dual-frequency optical reference source at respective first and second output frequencies $v_1 = v_{pump1} - v_B$ and $v_2 = v_{pump2} - v_B$ comprise stimulated Brillouin laser output generated by simultaneous optical pumping of the fiber optical resonator by the first and second pump laser sources, respectively, wherein an output difference frequency $v_2 - v_1$ is greater than about 300 GHz, wherein the dual-frequency optical source is stabilized so as to (i) maintain fluctuations of the output difference frequency $v_2 - v_1$ within an operationally acceptable optical bandwidth or (ii) maintain phase noise of an optical signal at the output difference frequency within an operationally acceptable reference phase noise level; and wherein the operationally acceptable bandwidth is less than about 100 Hz over about a 1 second timescale.

16. The dual-frequency optical source of claim 15 wherein the operationally acceptable bandwidth is less than about 1 Hz over about a 1 second timescale.

17. The dual-frequency optical source of claim 15 wherein the operationally acceptable reference phase noise level is about −40 dBc/Hz at 100 Hz offset frequency and about −80 dBc/Hz at 10 kHz offset frequency.

18. The dual-frequency optical source of claim 15 wherein the operationally acceptable reference phase noise level is about −80 dBc/Hz at 100 Hz offset frequency and about −125 dBc/Hz at 10 kHz offset frequency.

19. The dual-frequency optical source of claim 15 wherein each one of the first and second pump laser sources is frequency-locked to the corresponding resonant optical mode of the resonator by a Pound-Drever-Hall mechanism.

* * * * *